US012597907B2

(12) United States Patent     (10) Patent No.:   US 12,597,907 B2
Ishitaki et al.            (45) Date of Patent:     Apr. 7, 2026

(54) ACOUSTIC WAVE DEVICE INCLUDING MULTIPLE REGIONS WITH MULTIPLE ACOUSTIC VELOCITIES

(71) Applicant: Murata Manufacturing Co., Ltd., Nagaokakyo (JP)

(72) Inventors: Masayuki Ishitaki, Nagaokakyo (JP); Noriyoshi Ota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 818 days.

(21) Appl. No.: 17/985,188

(22) Filed: Nov. 11, 2022

(65) Prior Publication Data

US 2023/0077266 A1     Mar. 9, 2023

Related U.S. Application Data

(63) Continuation of application No. PCT/JP2021/016978, filed on Apr. 28, 2021.

(30) Foreign Application Priority Data

May 27, 2020    (JP) ................................. 2020-092024

(51) Int. Cl.
    *H03H 9/17*        (2006.01)
    *H03H 9/13*        (2006.01)

(52) U.S. Cl.
    CPC .............. *H03H 9/171* (2013.01); *H03H 9/13* (2013.01)

(58) Field of Classification Search
    CPC ...... H03H 9/171; H03H 9/13; H03H 9/02157; H03H 9/02574; H03H 9/14526;

(Continued)

(56) References Cited

U.S. PATENT DOCUMENTS

2010/0219905 A1*   9/2010   Nakamura ......... H03H 9/02881
                                              333/195
2011/0068655 A1     3/2011   Solal et al.

(Continued)

FOREIGN PATENT DOCUMENTS

JP      2011101350 A     5/2011
JP      2013518455 A     5/2013

(Continued)

OTHER PUBLICATIONS

International Search Report in PCT/JP2021/016978, mailed Jul. 13, 2021, 3 pages.

(Continued)

*Primary Examiner* — Emily P Pham
(74) *Attorney, Agent, or Firm* — Keating & Bennett, LLP

(57) ABSTRACT

An interdigital transducer electrode that is provided on a piezoelectric film includes a first busbar, a second busbar, multiple first electrode fingers, and multiple second electrode fingers. The first electrode fingers and the second electrode fingers overlap in a region in a direction in which an acoustic wave propagates, and the region includes a central region, a first edge region that is located between the central region and the first busbar, and a second edge region that is located between the central region and the second busbar. An acoustic velocity in the first edge region and the second edge region is lower than an acoustic velocity in the central region. An acoustic velocity in a busbar region is higher than the acoustic velocity in the central region.

20 Claims, 21 Drawing Sheets

(58) Field of Classification Search
CPC ........... H03H 9/02858; H03H 9/02881; H03H
9/1457; H03H 9/17
See application file for complete search history.

(56) References Cited

U.S. PATENT DOCUMENTS

| | | | |
|---|---|---|---|
| 2013/0051588 A1 | 2/2013 | Ruile et al. | |
| 2013/0285768 A1 | 10/2013 | Watanabe et al. | |
| 2018/0316333 A1* | 11/2018 | Nakamura | ............... H03H 9/54 |
| 2019/0123713 A1 | 4/2019 | Daimon | |
| 2020/0007107 A1 | 1/2020 | Daimon et al. | |
| 2021/0006223 A1 | 1/2021 | Daimon et al. | |

FOREIGN PATENT DOCUMENTS

| | | |
|---|---|---|
| JP | 2019080093 A | 5/2019 |
| WO | 2012086639 A1 | 6/2012 |
| WO | 2018173918 A1 | 9/2018 |
| WO | 2019194140 A1 | 10/2019 |

OTHER PUBLICATIONS

Written Opinion in PCT/JP2021/016978, mailed Jul. 13, 2021, 4 pages.

* cited by examiner

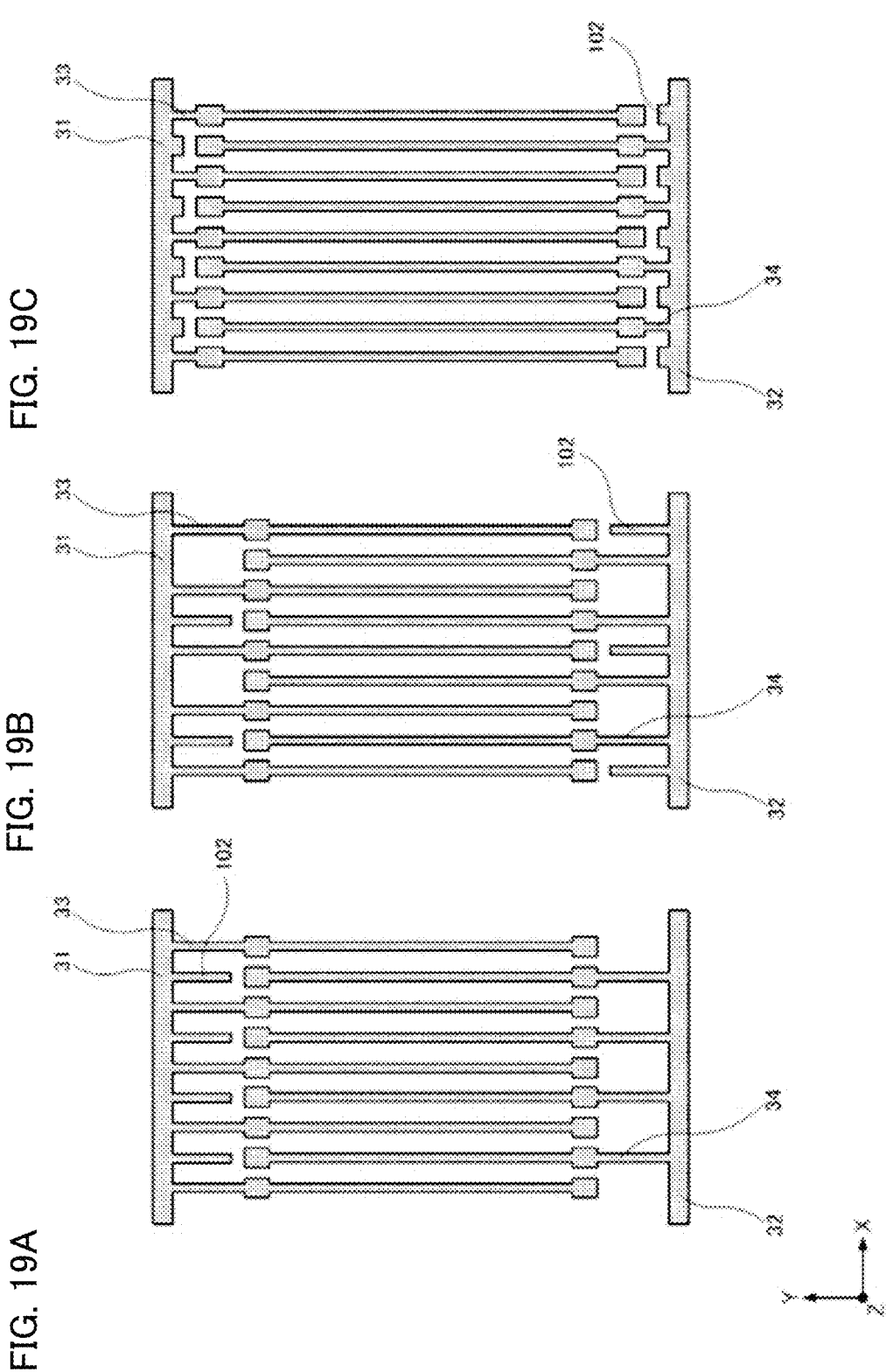

FIG.20
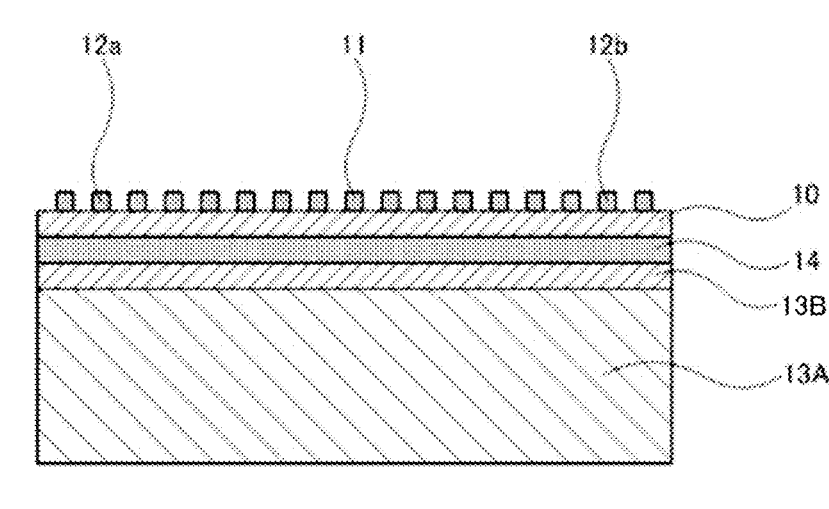
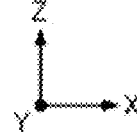

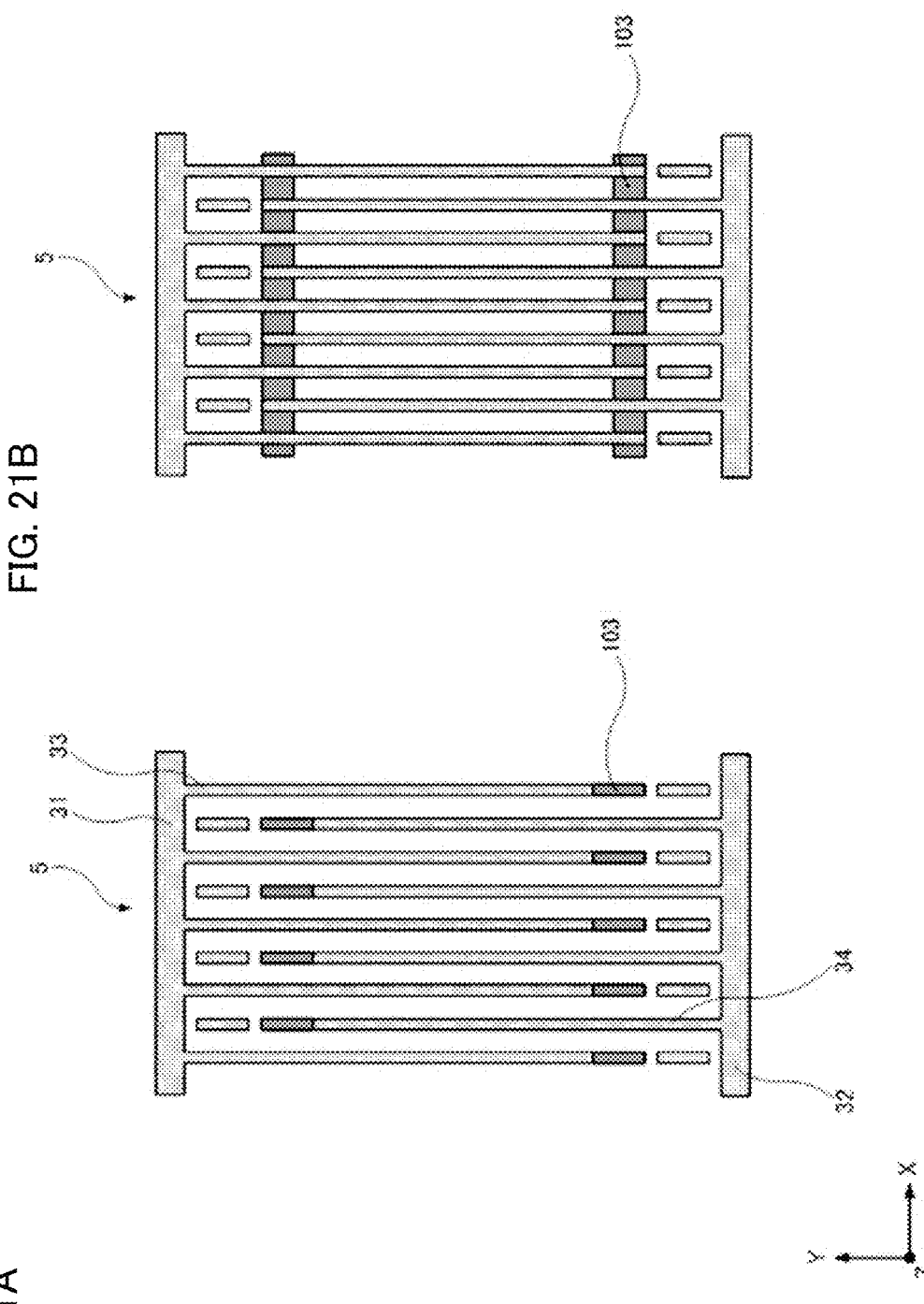

ACOUSTIC WAVE DEVICE INCLUDING MULTIPLE REGIONS WITH MULTIPLE ACOUSTIC VELOCITIES

CROSS REFERENCE TO RELATED APPLICATIONS

This application claims the benefit of priority to Japanese Patent Application No. 2020-092024, filed on May 27, 2020, and is a Continuation Application of PCT Application No. PCT/JP2021/016978, filed on Apr. 28, 2021. The entire contents of each application are hereby incorporated herein by reference.

BACKGROUND OF THE INVENTION

1. Field of the Invention

The present invention relates to an acoustic wave device such as a surface acoustic wave device or a boundary acoustic wave device, and more specifically, to an acoustic wave device in which a high acoustic velocity material layer, a low acoustic velocity material layer, and a piezoelectric film are stacked.

2. Description of the Related Art

A known acoustic wave includes a piezoelectric substrate, first and second busbars that oppose each other, and multiple first and second electrode fingers. Each of the multiple electrodes has an edge spaced from the opposing busbar, and a gap is formed between the edge of the electrode and the opposing busbar. For example, Japanese Unexamined Patent Application Publication No. 2011-101350 discloses that the length of the gap described above is preferably 1 acoustic wavelength ($1\lambda$) or more. Each of the multiple electrode fingers includes a portion having an edge region that is adjacent to the edge and that extends along a transducer in the longitudinal direction. With this structure, the velocity of an acoustic wave in the edge region is lower than the velocity in a central region of the transducer, and the velocity in a gap region is higher than the velocity in the central region of the transducer. It is disclosed that a piston mode is obtained due to a relationship in acoustic velocity and that a transverse mode can be inhibited.

As for an acoustic wave device in International Publication No. 2012/086639, a high acoustic velocity film, a low acoustic velocity film, a piezoelectric film, and an interdigital transducer electrode are stacked in this order on a support substrate. It is disclosed that this structure enables a Q value to be increased.

In the case where the acoustic wave devices described above are combined to obtain an acoustic wave device that has a high Q value and that reduces a ripple in the transverse mode, the acoustic velocity of an acoustic wave in a busbar region changes from a low acoustic velocity (lower than the velocity of an acoustic wave in the central region) to a high acoustic velocity (higher than the velocity of the acoustic wave in the central region). Accordingly, in some cases, a high acoustic velocity region increases, and it is difficult to reduce the ripple in the transverse mode with certainty.

SUMMARY OF THE INVENTION

Preferred embodiments of the present invention provide acoustic wave devices that each have a high Q value and each enable a ripple in a transverse mode to be effectively reduced.

An acoustic wave device according to a preferred embodiment of the present invention includes a piezoelectric film, a high acoustic velocity material layer through which a bulk wave propagates at an acoustic velocity higher than an acoustic velocity at which an acoustic wave propagates through the piezoelectric film, a low acoustic velocity material layer through which a bulk wave propagates at an acoustic velocity lower than an acoustic velocity at which a bulk wave propagates through the piezoelectric film, and an interdigital transducer electrode provided on the piezoelectric film. The low acoustic velocity material layer and the piezoelectric film are stacked in this order on the high acoustic velocity material layer. The interdigital transducer electrode includes a first busbar and a second busbar that oppose each other, multiple first electrode fingers each of which includes a base end that is connected to the first busbar and a tip end that extends toward the second busbar, and multiple second electrode fingers each of which includes a base end that is connected to the second busbar and a tip end that extends toward the first busbar. The first electrode fingers and the second electrode fingers overlap in an overlapping region in a direction in which the acoustic wave propagates, and the overlapping region includes a central region, a first edge region that is located between the central region and the first busbar, and a second edge region that is located between the central region and the second busbar. An acoustic velocity in the first and second edge regions is lower than an acoustic velocity in the central region. An acoustic velocity in a busbar region in which the first busbar and the second busbar are provided is higher than the acoustic velocity in the central region. A first region is put between the first edge region and the first busbar, a second region is put between the second edge region and the second busbar, and an acoustic velocity in a portion of the second region and the first region is lower than the acoustic velocity in the busbar region.

According to preferred embodiments of the present disclosure, acoustic wave devices in each of which a high acoustic velocity material layer, a low acoustic velocity material layer, and a piezoelectric film are stacked has a high Q value and enables a ripple in a transverse mode to be reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 17A and 17B are partially cut plan views of an electrode structure and the acoustic velocity in regions according to a first modification to the acoustic wave device according to the second preferred embodiment of the present invention.

FIGS. 19A through 19C are partially cut plan views of electrode structures according to second to fourth modifications to the acoustic wave device according to the second preferred embodiment of the present invention.

FIG. 20 is a front view of a section of an acoustic wave device according to a third preferred embodiment of the present invention.

FIGS. 21A and 21B are partially cut plan views of a principal portion of an acoustic wave device according to a fourth preferred embodiment of the present invention.

DETAILED DESCRIPTION OF THE PREFERRED EMBODIMENTS

Figure 1:
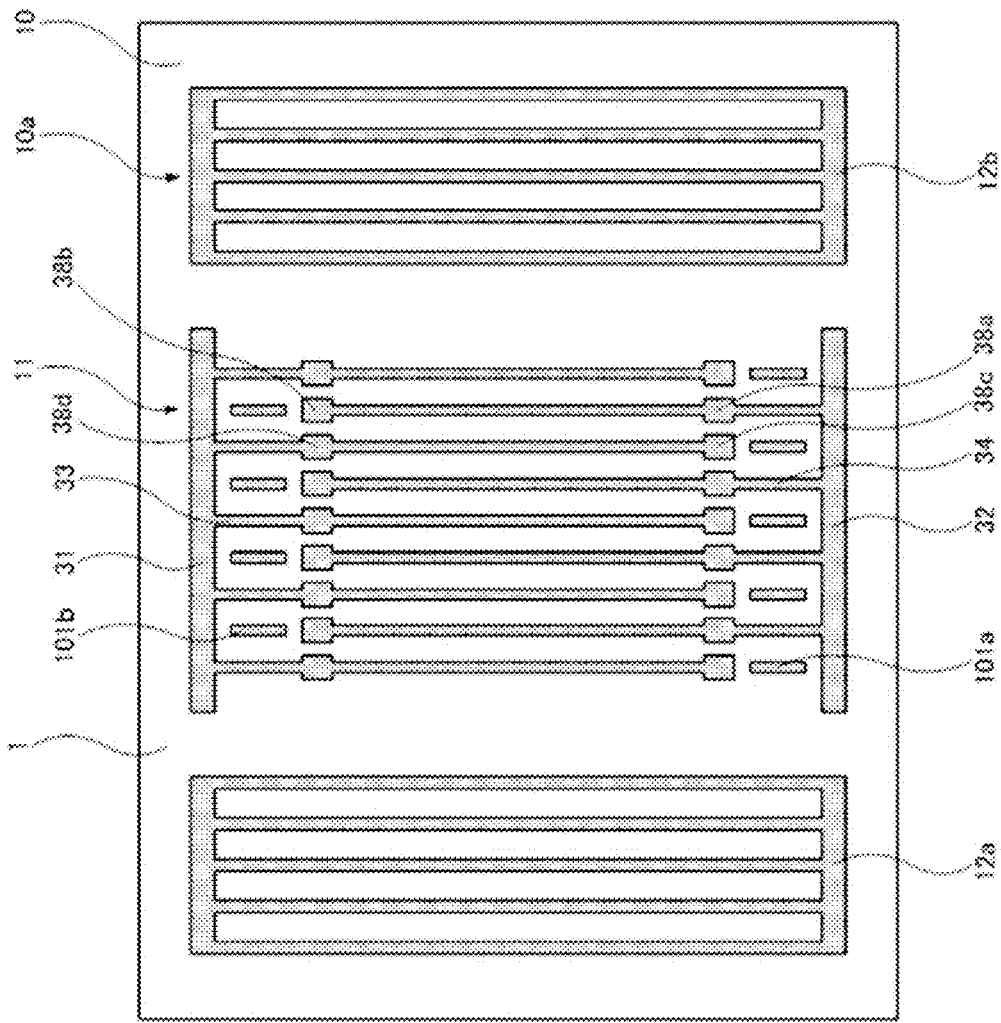
FIG. 1 is a plan view of a principal portion of an electrode structure of an acoustic wave device according to a first preferred embodiment of the present invention.

Preferred embodiments of the present invention will hereinafter be described by way of example. The preferred embodiments described below are just examples. The present invention is not limited to the preferred embodiments described below.

In the drawings referred by, for example, the preferred embodiments of the present invention, members that have the same or substantially the same functions are designated by the same reference signs. The drawings referred by, for example, the preferred embodiments are schematically illustrated, and the ratios of dimensions of an object that is shown in the drawings differ from the ratios of actual dimensions of the object in some cases. In some cases, the ratios of the dimensions of the object, for example, differ from each other among the drawings. Specific ratios of the dimensions of the object, for example, are to be determined by referring the following description.

In the description of preferred embodiments of the present invention and claims, the upward direction or the downward direction of an acoustic wave device may be any direction. In the following description, however, for convenience, an orthogonal coordinate system xyz is defined. In an xy plane, a positive y-direction (the upward direction in the paper in FIG. 1) corresponds to the upward direction, and a negative y-direction (the downward direction in the paper in FIG. 1) corresponds to the downward direction. In an xz plane, a positive z-direction (the upward direction in the paper in FIG. 2) corresponds to the upward direction, and a negative z-direction (the downward direction in the paper in FIG. 2) corresponds to the downward direction. The words the "upward direction, the "downward direction", "up", and "down", for example, are used.

FIRST PREFERRED EMBODIMENT

Figure 2:
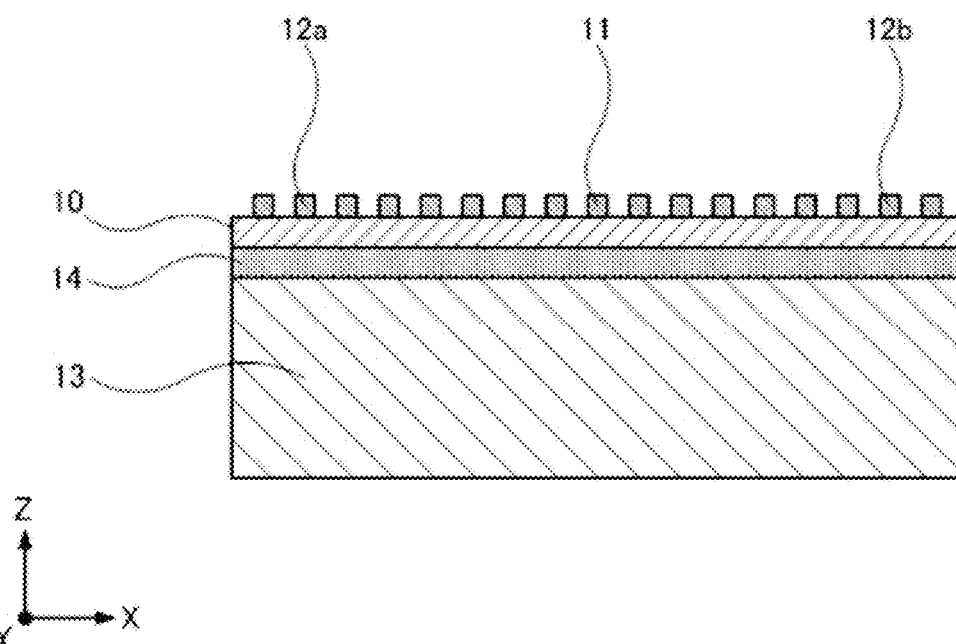
FIG. 2 is a front view of a section of the acoustic wave device according to the first preferred embodiment of the present invention.

FIG. 1 is a plan view of a principal portion of an electrode structure of an acoustic wave device 1 according to a first preferred embodiment of the present invention. FIG. 2 schematically illustrates a front view of a section of the acoustic wave device 1 according to the first preferred embodiment of the present invention.

As illustrated in FIG. 1, a piezoelectric film 10 includes a main surface 10a. An interdigital transducer electrode 11 is provided on the main surface 10a. An alternating voltage is applied to the interdigital transducer electrode 11, and consequently, an acoustic wave is excited. A reflector 12 that includes a reflector 12a and a reflector 12b is provided on both sides of the interdigital transducer electrode 11 in a direction (an x-direction) in which the acoustic wave propagates. The reflector 12 extends in a direction (a y-direction) perpendicular or substantially perpendicular to the direction (the x-direction) in which the acoustic wave propagates and includes multiple reflection electrode fingers that are parallel or substantially parallel to each other.

As illustrated in FIG. 2, the acoustic wave device 1 includes a high acoustic velocity support substrate 13 that defines and functions as a high acoustic velocity material layer, a low acoustic velocity material layer 14, and the piezoelectric film 10 made of lithium tantalate, for example. The low acoustic velocity material layer 14 and the piezoelectric film 10 are stacked in this order on the high acoustic velocity support substrate 13. In other words, the low acoustic velocity material layer 14 is stacked on the high acoustic velocity support substrate 13, and the piezoelectric film 10 is stacked on the low acoustic velocity material layer 14. The interdigital transducer electrode 11 and the reflector 12 (12a and 12b) are provided on the piezoelectric film 10. Consequently, a single-port acoustic wave resonator is defined.

A high acoustic velocity material of which the high acoustic velocity material layer is made is a material that causes the acoustic velocity of a propagating bulk wave to be higher than the acoustic velocity of an acoustic wave that propagates through the piezoelectric film 10. A low acoustic velocity material of which the low acoustic velocity material layer 14 is made is a material that causes the acoustic velocity of a propagating bulk wave to be lower than the acoustic velocity of a bulk wave that propagates through the piezoelectric film 10.

The high acoustic velocity support substrate 13 can be made of, for example, sapphire, crystal, silicon carbide, or silicon. Examples of the low acoustic velocity material can include inorganic insulating materials such as silicon oxide and silicon oxynitride and a resin material.

As for the high acoustic velocity material and the low acoustic velocity material, an appropriate combination of the materials can be used provided that the relationship in acoustic velocity described above is satisfied.

A multilayer substrate in which the low acoustic velocity material layer 14 and the piezoelectric film 10 are stacked on the high acoustic velocity support substrate 13 as described above can effectively confine the energy of the acoustic wave within the piezoelectric film 10.

The piezoelectric film 10 may be made of piezoelectric single crystal other than lithium tantalate such as, for example, lithium niobate or appropriate piezoelectric ceramics.

The interdigital transducer electrode 11 is preferably made of a multilayer metal film in which multiple metal layers are stacked. Examples of the metal include Al, W, Mo, Ta, Hf, Cu, Pt, Ti, Au, Ag, Ni, Zn, Cr, and alloys containing these as main components. The interdigital transducer electrode 11 may include a single metal layer.

The interdigital transducer electrode 11 includes a first busbar 31 and a second busbar 32 that oppose each other. In addition, the interdigital transducer electrode 11 includes multiple first electrode fingers 33 and multiple second electrode fingers 34. Each of the multiple first electrode fingers 33 includes a base end that is connected to the first busbar 31 and a tip end that extends toward the second busbar 32. Each of the multiple second electrode fingers 34 includes a base end that is connected to the second busbar 32 and a tip end that extends toward the first busbar 31.

The first electrode fingers 33 and the second electrode fingers 34 include wide portions. A dimension in a direction (a direction in which the acoustic wave propagates) perpendicular or substantially perpendicular to a direction in which the electrode fingers extend is a dimension in a width direction. In this case, the wide portions have a dimension in the width direction larger than that at a center in the direction in which the electrode fingers extend. The wide portions that are included in the first electrode fingers 33 and the second electrode fingers 34 are referred to as electrode finger wide portions for convenience. In this case, as for the first electrode fingers 33 and the second electrode fingers 34, electrode finger wide portions 38b and 38c are located near the tip ends of the electrode fingers, and electrode finger wide portions 38a and 38d are located near the base ends of the electrode fingers.

Members that include long sides extending in the direction in which the electrode fingers extend, here, floating electrodes 101a that are not connected to the second busbar 32 and that have a rectangular shape are provided between the electrode finger wide portions 38c near the tip ends of the first electrode fingers 33 and the opposing second busbar 32. Similarly, floating electrodes 101b that are not connected to the first busbar 31 and that have a rectangular shape are provided between the electrode finger wide portions 38b near the tip ends of the second electrode fingers 34 and the opposing first busbar 31.

Figures 3A, 3B:
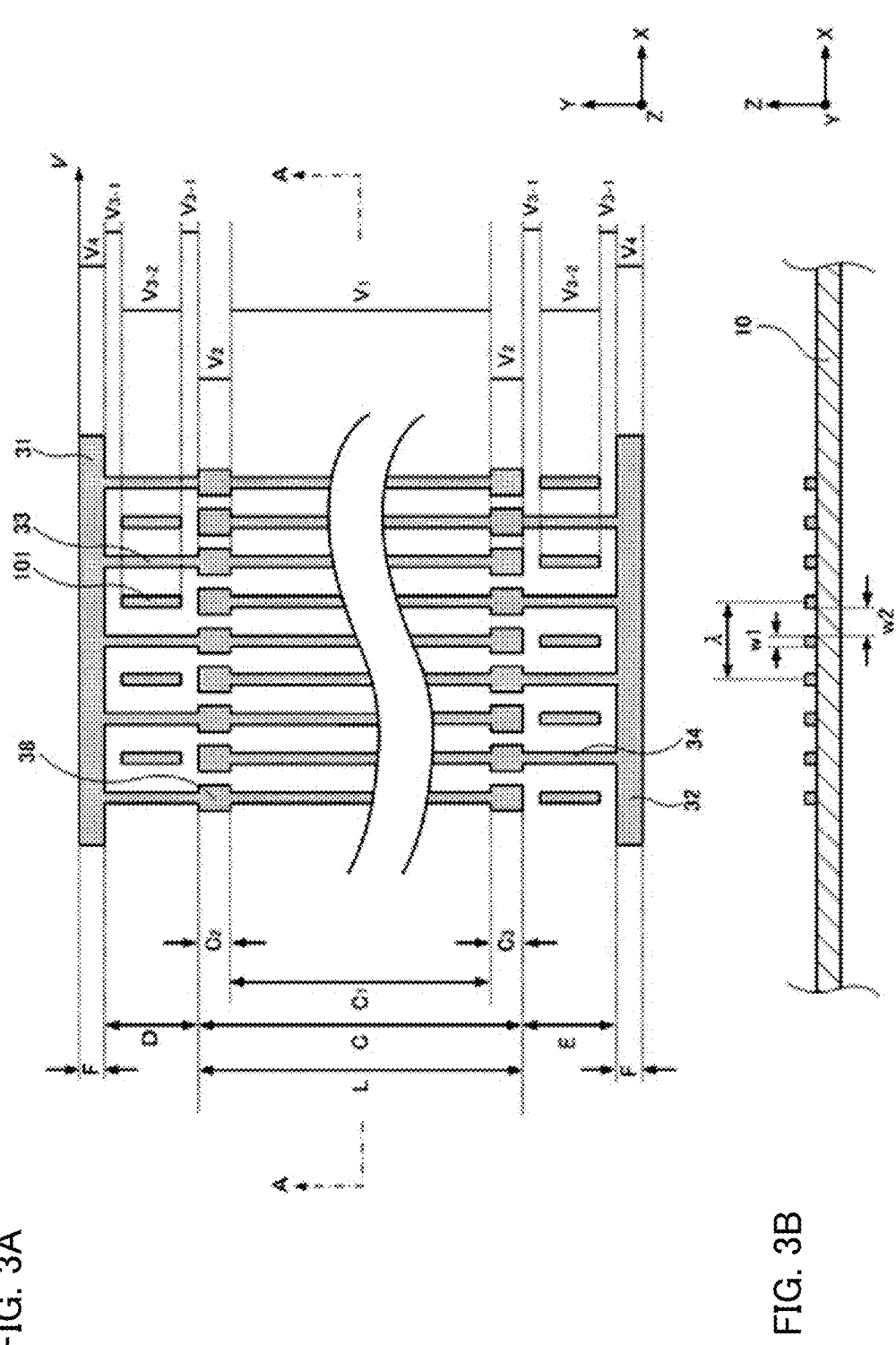
FIGS. 3A and 3B are partially cut plan views of an enlarged portion in FIG. 1 and illustrates a relationship in acoustic velocity in regions.

FIG. 3A is a partially cut plan view of an enlarged portion in FIG. 1 and illustrates a relationship in acoustic velocity in regions. The first electrode fingers 33 and the second electrode fingers 34 overlap in an overlapping region C in the direction in which the acoustic wave propagates, and the overlapping region C includes a central region C1, a first edge region C2 that is located between the central region C1 and the first busbar 31, and a second edge region C3 that is provided between the central region C1 and the second busbar 32. A first region D is between the first edge region C2 and the first busbar 31. A second region E is between the second edge region C3 and the second busbar 32.

The velocity (acoustic velocity) V of an acoustic wave that propagates through each region in FIG. 3A increases as the position thereof is nearer to the right in FIGS. 3A and 3B (a +x-direction).

As for the acoustic wave device 1 according to the present preferred embodiment, an acoustic velocity V2 in the first edge region C2 and the second edge region C3 is lower than an acoustic velocity V1 in the central region C1. An acoustic velocity V4 in busbar regions F in which the busbars are provided is higher than the acoustic velocity V1 in the central region C1. That is, edge regions that are low acoustic velocity regions and the busbar regions that are high acoustic velocity regions are arranged in this order in the direction in which the electrode fingers extend along both of outer side portions of the central region C1. These relationships enable a piston mode to be activated and enable a ripple in a transverse mode to be reduced.

An acoustic velocity V31 in regions in which the floating electrodes 101 are not provided in the first region D and the second region E, specifically, regions that are put between the floating electrodes and the wide portions and regions that are put between the floating electrodes and the busbars is higher than an acoustic velocity V4 in the busbar regions F. An acoustic velocity V32 in regions in which the floating electrodes 101 are provided is lower than the acoustic velocity V4 in the busbar regions F. This relationship in acoustic velocity enables the piston mode to be more effectively activated.

Figure 4:
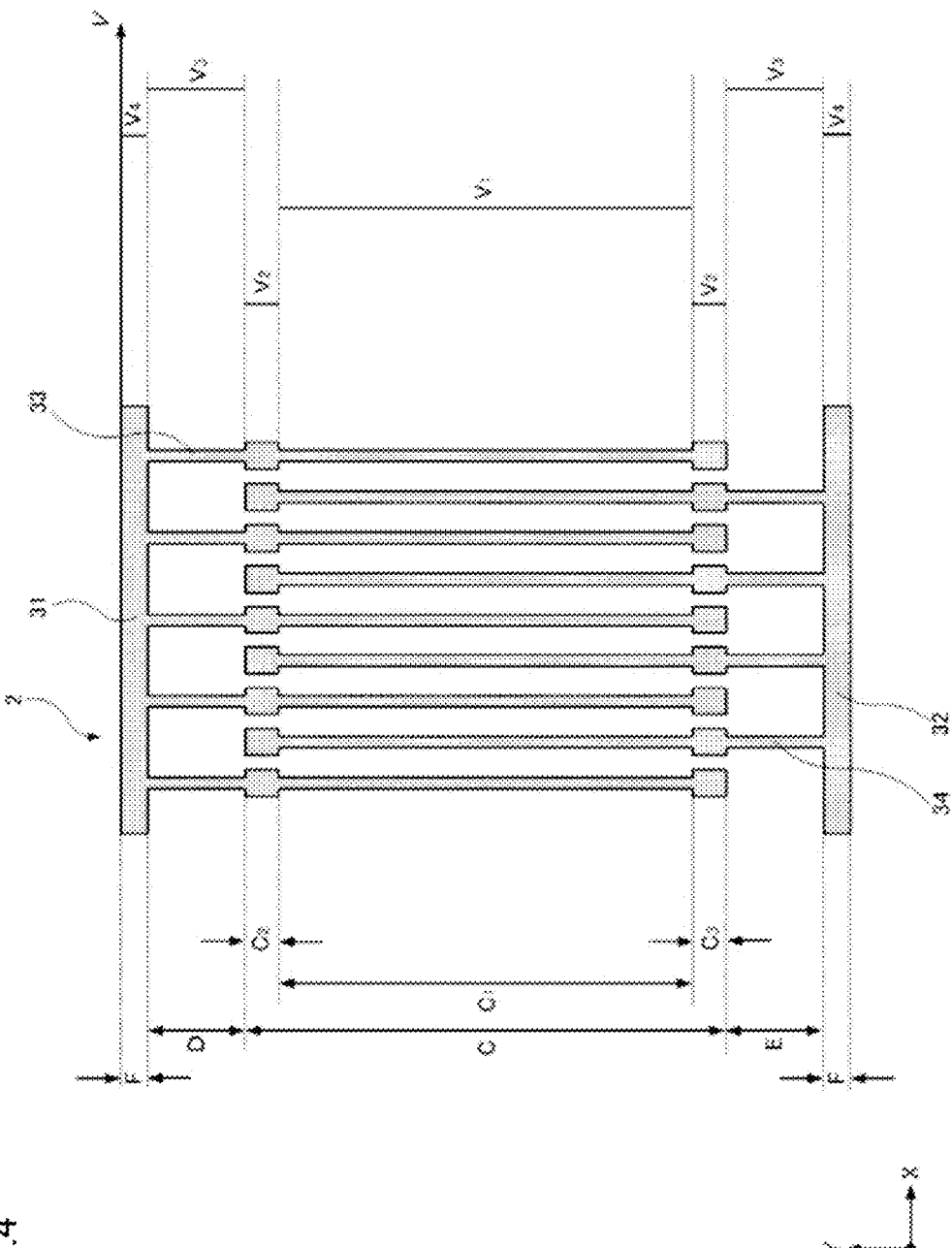
FIG. 4 is a partially cut plan view of a principal portion of an acoustic wave device that includes a structure in a comparative example.

FIG. 4 is a partially cut plan view of an acoustic wave device 2 that has a structure in a comparative example and illustrates a relationship in acoustic velocity in regions. The acoustic wave device 2 in the comparative example differs from the acoustic wave device 1 according to the first preferred embodiment in that no members are provided in the first region D and the second region E.

Attention is directed to the relationship in acoustic velocity. As for the acoustic wave device 2 in the comparative example, the acoustic velocity in the entirety of the second region E and the first region D is higher than the acoustic velocity V4 in the busbar regions F. As for the acoustic wave device 1 according to the present preferred embodiment, the acoustic velocity V32 in partial regions in the first region D and the second region E is lower than the acoustic velocity V4 in the busbar regions F. In other words, an acoustic velocity in partial regions in existing high acoustic velocity regions decreases. In particular, according to the preferred embodiment, the acoustic velocity in portions of the existing high acoustic velocity regions decreases to the same level as the acoustic velocity in the central region C1, and the acoustic velocity is not higher than that in the central region C1.

It is not necessary for the acoustic velocity in the entirety of the second region E or the first region D to be lower than the acoustic velocity V4 in the busbar regions. It is only preferred that the acoustic velocity in partial regions in the second region E and the first region D is lower than the acoustic velocity V4 in the busbar regions. More precisely, it is only preferred that the acoustic velocity at least in a portion of the first region D or a portion of the second region E to be lower than the acoustic velocity V4 in the busbar regions.

The interdigital transducer electrode 11 thus has the relationship in acoustic velocity, and consequently, the high acoustic velocity regions according to the present preferred embodiment decrease unlike those in FIG. 4. The piston mode is more effectively activated, and the ripple in the transverse mode can be reduced.

According to the present preferred embodiment, the piston mode is used, the acoustic velocity in partial regions in the second region E and the first region D is lower than the acoustic velocity in the busbar regions F, the high acoustic velocity regions decrease, and the ripple in the transverse mode can be effectively reduced. This will be described based on the result of a specific simulation.

The electrode parameters of the interdigital transducer electrode 11 when the simulation is carried out will now be described.

The wavelength of a resonator is defined by using a wavelength $\lambda$ that corresponds to a repetition period of the multiple first electrode fingers 33 or the second electrode fingers 34 that are included in the interdigital transducer electrode 11 illustrated in FIG. 3A. The overlap width L of each of interdigital pairs of the first electrode fingers 33 and the second electrode fingers 34 corresponds to an electrode finger length in which the first electrode fingers 33 and the second electrode fingers 34 overlap when viewed in the direction in which the acoustic wave propagates. FIG. 3B is a sectional view of FIG. 3A taken along line A-A. Pitches p between the multiple first electrode fingers 33 and the second electrode fingers 34 are preferably equal to about ½ of the wavelength $\lambda$ and are defined as (w1+w2) where w1 is the line width of each first electrode finger 33 and each second electrode finger 34, and w2 is the width of a space between each first electrode finger 33 and the second electrode finger 34 adjacent thereto. The electrode duty of each resonator corresponds to a line width occupancy ratio of the multiple first electrode fingers 33 and the second electrode fingers 34, which is a ratio of the line width to the sum of the space width and the line width of each of the multiple first electrode fingers 33 and the second electrode fingers 34, and is defined as w1/(w1+w2).

In particular, for example, as for the electrode parameters of the resonator that is included in the acoustic wave device 1 according to the first preferred embodiment, the wavelength $\lambda$ is about 1.5 µm, the number of pairs N is 380, and electrode duty R is about 0.45.

Figure 5A:
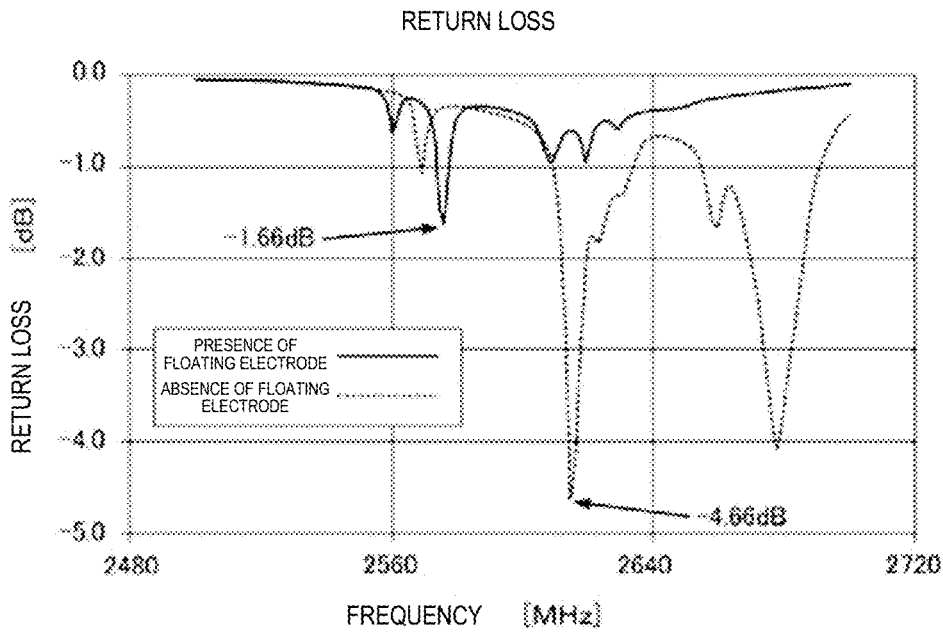
FIGS. 5A and 5B illustrate the return loss characteristics of the acoustic wave device according to the first preferred embodiment of the present invention depending on the presence or absence of floating electrodes.
Figure 5B:
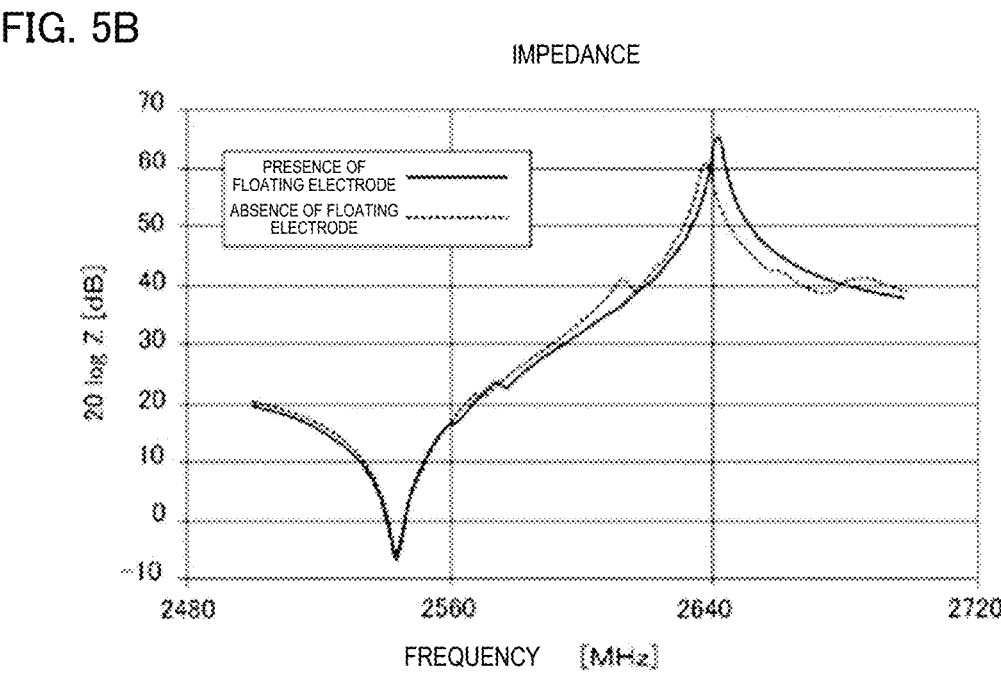

FIGS. 5A and 5B illustrate the return loss characteristics and impedance characteristics depending on the presence or absence of the floating electrodes 101 in the first region D and the second region E of the acoustic wave device 1. In FIGS. 5A and 5B, a solid line represents the case where the floating electrodes are placed, and a dashed line represents the case where the floating electrodes are not provided.

As clear from FIG. 5A, it can be understood that in the case where the floating electrodes 101 are present, the value of the return loss is good unlike the case where the floating electrodes 101 are not present. In particular, the worst value of the return loss is improved from about −4.5 dB to about −1.5 dB. The ripple in the acoustic wave device is typically reduced by improving the worst value of the return loss of the resonator that is included in the acoustic wave device. Accordingly, the floating electrodes 101 improve the worst value of the return loss and enable the ripple in the transverse mode to be effectively reduced. The size of each floating electrode 101 described herein in the direction (the y-direction) in which the electrode fingers extend is about 1λ where λ is the wavelength of a surface acoustic wave.

As clear from FIG. 5B, it can be understood that in the case where the floating electrodes 101 are present, the impedance characteristics are good unlike the case where the floating electrodes 101 are not present and that the ripple is reduced.

Figure 6:
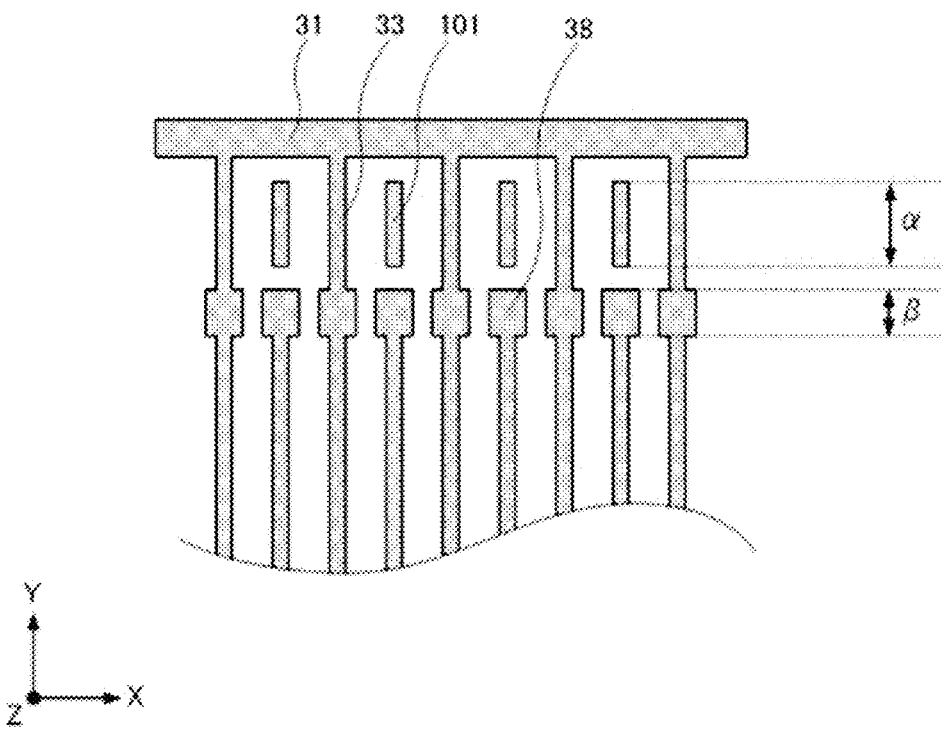
FIG. 6 is a plan view of an enlarged portion in FIG. 1.

Based on the results described above, the size $\alpha$ of each floating electrode 101 illustrated in FIG. 6 in the direction in which the electrode fingers extend and the size $\beta$ of each electrode finger wide portion in the direction in which the electrode fingers extend in the acoustic wave device 1 were changed into various values, and the return loss characteristics were evaluated. The result is illustrated in FIGS. 7A and 7B and FIGS. 8A and 8B.

Figure 7A:
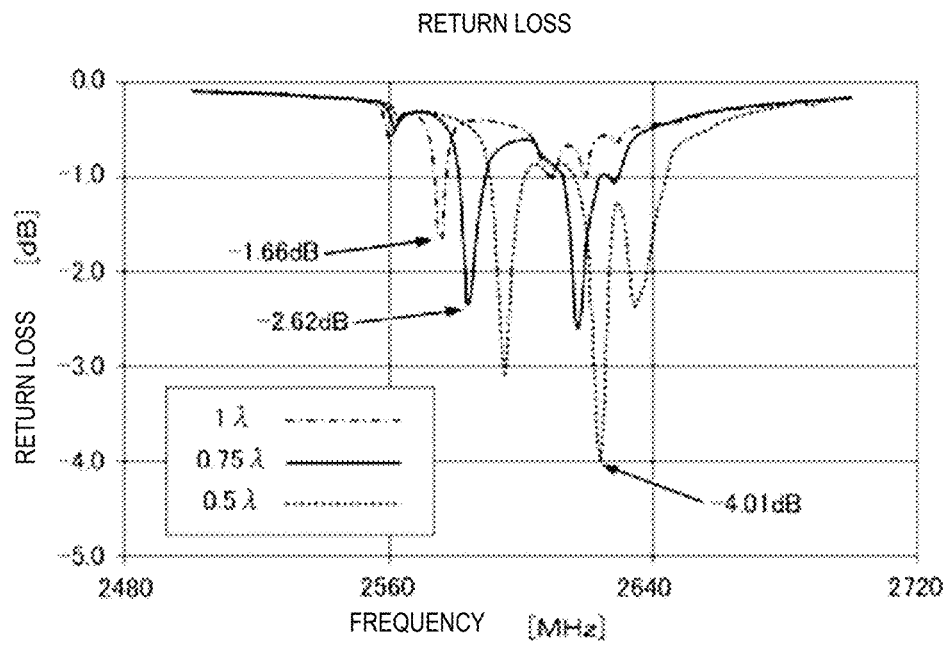
FIGS. 7A and 7B illustrate relationships among the impedance, the return loss, and the size of each floating electrode of the acoustic wave device according to the first preferred embodiment of the present invention.
Figure 7B:
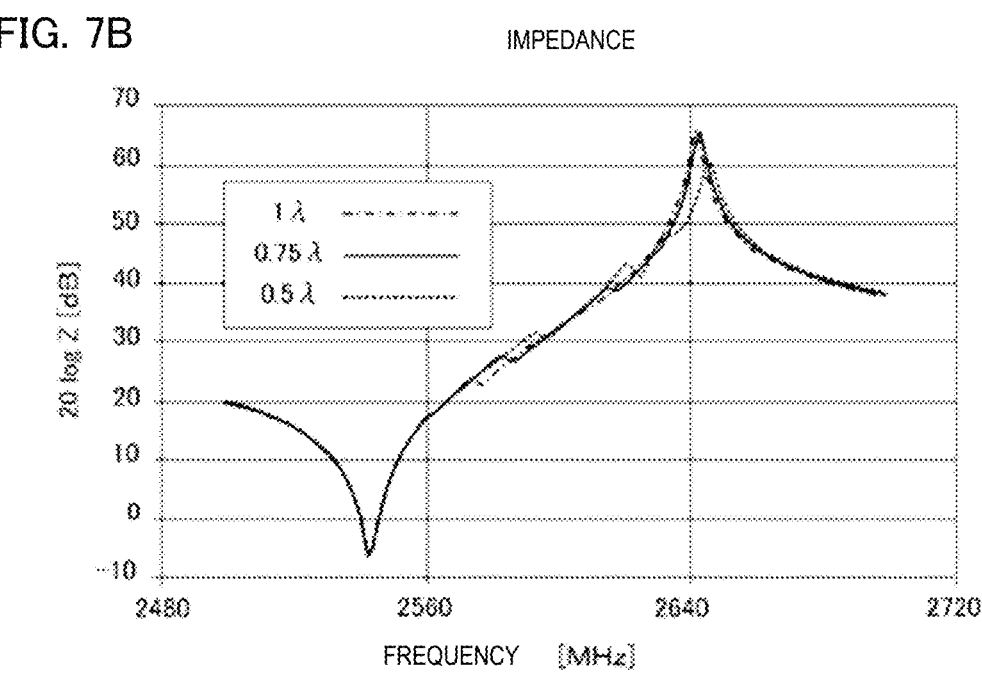

In FIGS. 7A and 7B, a solid line represents the return loss in the case where $\alpha$=about 0.75λ is satisfied, a dashed line represents the return loss characteristics and the impedance characteristics in the case where $\alpha$=about 0.5λ is satisfied, and a one-dot chain line represents the return loss characteristics and the impedance characteristics in the case where $\alpha$=about 1λ is satisfied. It can be understood from FIG. 7A that in the case where the size $\alpha$ of each floating electrode 101 in the direction in which the electrode fingers extend is about 0.5λ, the worst value of the return loss is about −4.0 dB and is large whereas the worst values of the return loss in the cases of about 0.75λ and about 1λ are about −2.6 dB and about −1.6 dB and are small. As clear from FIG. 7B, it can be understood that the impedance characteristics are good in the cases of about 0.75λ and a unlike the case where the size $\alpha$ of each floating electrode 101 in the direction in which the electrode fingers extend is about 0.5λ. Accordingly, in the case where the size $\alpha$ of each floating electrode 101 in the direction in which the electrode fingers extend is about 0.75λ or more, the ripple in the transverse mode can be effectively reduced. The size $\alpha$ of each floating electrode 101 in the direction in which the electrode fingers extend may be about 3λ or less. In this case, productivity is likely to be improved.

Figure 8A:
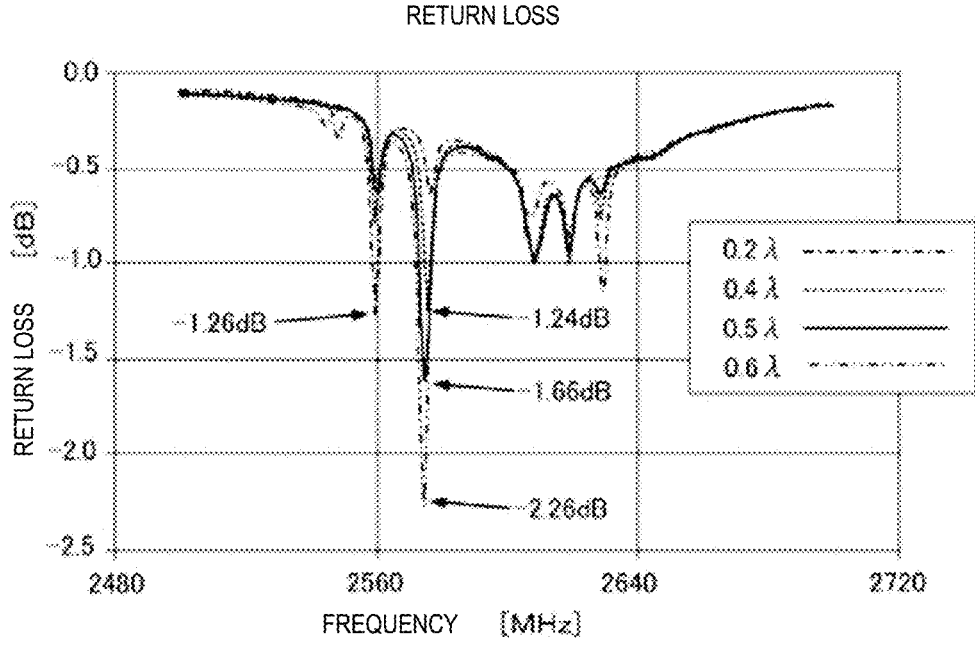
FIGS. 8A and 8B illustrate relationships between the return loss and the size of a wide portion of each of electrode fingers of an interdigital transducer electrode of the acoustic wave device according to the first preferred embodiment of the present invention.
Figure 8B:
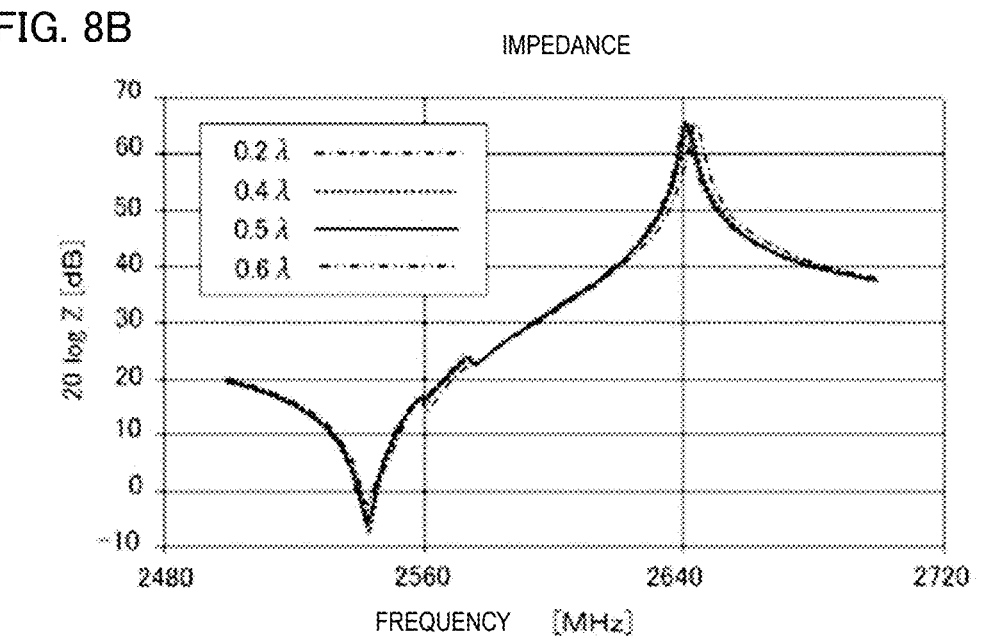

In FIGS. 8A and 8B, a one-dot chain line represents the return loss characteristics and the impedance characteristics in the case where $\beta$=about 0.2λ is satisfied, a dashed line represents the return loss characteristics and the impedance characteristics in the case where $\beta$=about 0.4λ is satisfied, a solid line represents the return loss characteristics and the impedance characteristics in the case where $\beta$=about 0.5λ is satisfied, and a two-dot chain line represents the return loss characteristics and the impedance characteristics in the case where $\beta$=about 0.6λ is satisfied. As clear from FIG. 8A, the worst value of the return loss is about −2.0 dB in the cases where $\beta$ is about 0.2λ whereas the worst value of the return loss is improved to about −1.2 dB to about −1.7 dB in the cases where $\beta$ is about 0.4λ, $\beta$ is about 0.5λ, and $\beta$ is about 0.6λ. It can be understood that in FIG. 8B, the impedance characteristics are good in the cases where $\beta$ is about 0.4λ$\beta$ is about 0.5λ, and $\beta$ is about 0.6λ unlike the case where $\beta$ is about 0.2λ. Accordingly, in the case where the size $\beta$ of each electrode finger wide portion in the direction in which the electrode fingers extend satisfies about $0.4\lambda \leq \beta \leq$ about $0.6\lambda$, the ripple in the transverse mode can be effectively reduced.

Modification to First Preferred Embodiment

Figures 9A, 9B:
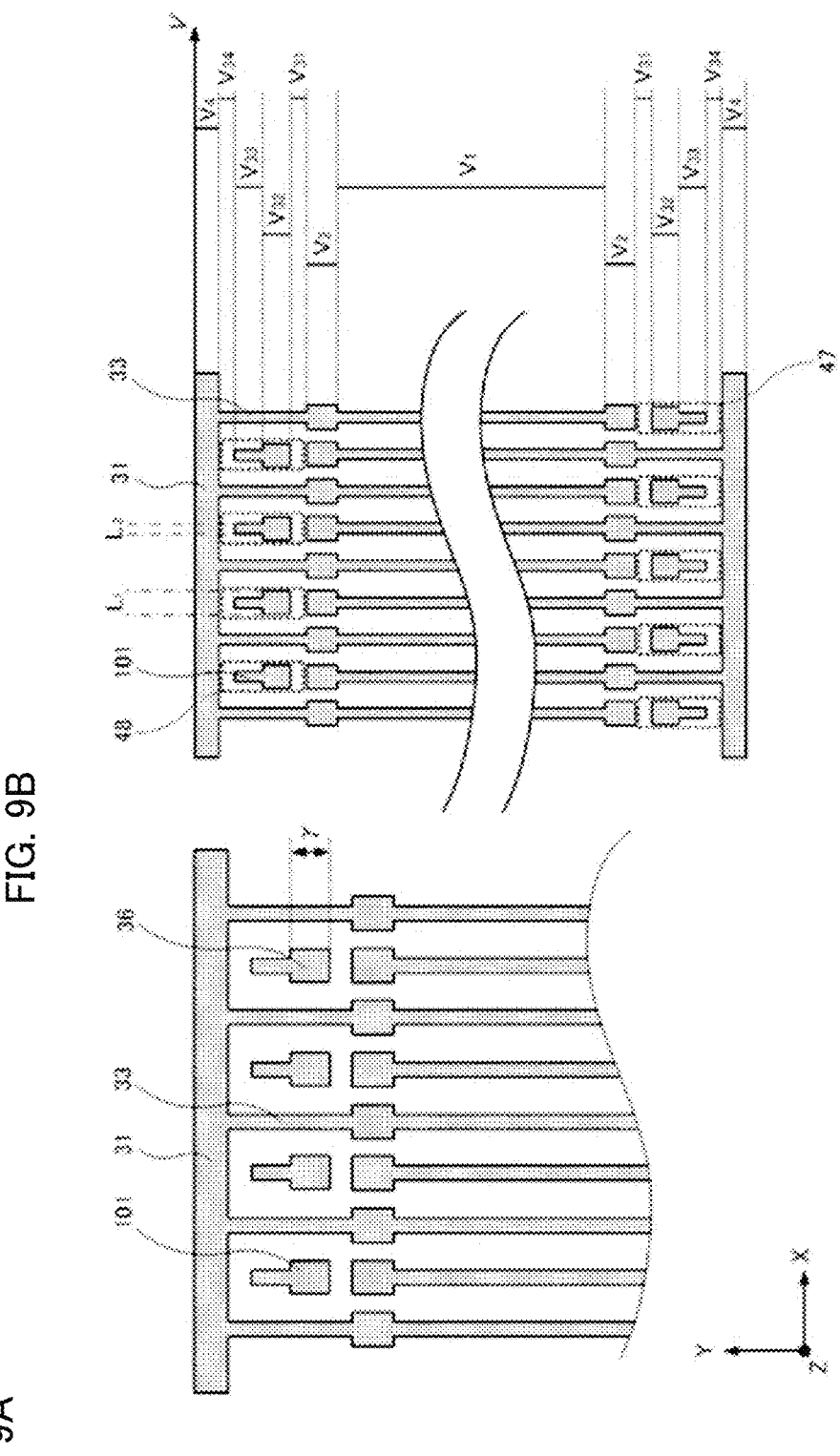
FIGS. 9A and 9B are partially cut plan views of an electrode structure and the acoustic velocity in regions according to a first modification to the acoustic wave device according to the first preferred embodiment of the present invention.

FIGS. 9A and 9B are partially cut plan views of an electrode structure and the acoustic velocity in regions according to a first modification to the acoustic wave device 1 according to the first preferred embodiment. The acoustic wave device 1 according to the first modification has the same structure as the acoustic wave device 1 according to the first preferred embodiment except for the floating electrodes 101 that include wide portions and the relationship in acoustic velocity in the regions of the floating electrodes 101 and the central region C1.

The floating electrodes 101 according to the first modification have at least two different dimensions in the width direction that is perpendicular to the direction in which the electrode fingers extend. More specifically, the floating electrodes 101 include the wide portions, and portions that have the largest dimension in the width direction among the multiple dimensions in the width direction are referred to as first wide portions 36. In this case, the floating electrodes 101 have at least the two different dimensions in the width direction at the first wide portions 36 and portions that differ from the first wide portions 36.

The acoustic velocity in the regions of the acoustic wave device 1 according to the first modification is illustrated in FIG. 9B. The acoustic velocity in the central region C1 is V1. The acoustic velocity in the first edge region C2 and the second edge region C3 is V2. The acoustic velocity in the busbar regions F is V4. The acoustic velocity in the first region D and the second region E between the first edge region C2 and the busbar regions F and between the second edge region C3 and the busbar regions F has different values. The acoustic velocity in regions between the first edge region C2 and the floating electrodes 101 and between the second edge region C3 and the floating electrodes 101 is V31. The acoustic velocity in the regions of the first wide portions 36 of the floating electrodes is V32. The acoustic velocity in regions of the floating electrodes outside the first wide portions 36 is V33. The acoustic velocity in regions between the floating electrodes 101 and the busbar regions F is V34. In this case, the acoustic velocities V1, V2, V31 to V34, and V4 satisfy a relationship of $V34 \approx V31 > V4 > V1 \approx V33 > V32 > V2$.

In this case, the acoustic velocity V32 in the first wide portions 36 of the floating electrodes is lower than the acoustic velocity V4 in the busbar regions F and the acoustic velocity V1 in the central region C1. Accordingly, the regions of the first wide portions 36 of the floating electrodes are the low acoustic velocity regions. Accordingly, the high acoustic velocity regions further decrease, and the ripple in the transverse mode can be reduced more than that according to the first preferred embodiment.

As illustrated in FIG. 9B, in the first region D (see FIGS. 3A and 3B), members (here, the floating electrodes) that extend in the direction in which the electrode fingers extend are located on extension lines 47 along which the tip ends of the first electrode fingers 33 extend toward the second busbar 32. Similarly, in the second region E (see FIGS. 3A and 3B), members (here, the floating electrodes) that extend in the direction in which the electrode fingers extend are located on extension lines 48 along which the tip ends of the second electrode fingers 34 extend toward the first busbar 31. The members that extend in the direction in which the electrode fingers extend are located at least on the extension lines 47 or the extension lines 48. The case where the members are located on the extension lines includes not only the case where the members are located only on the extension lines but also the case where the members at least partly overlap the extension lines in a plan view.

In this case, the floating electrodes 101 are preferably aligned on straight lines together with the electrode fingers in the direction in which the electrode fingers extend. This facilitates manufacture unlike the case where the floating electrodes 101 are not located on the extension lines 47 and 48.

Figure 10A:
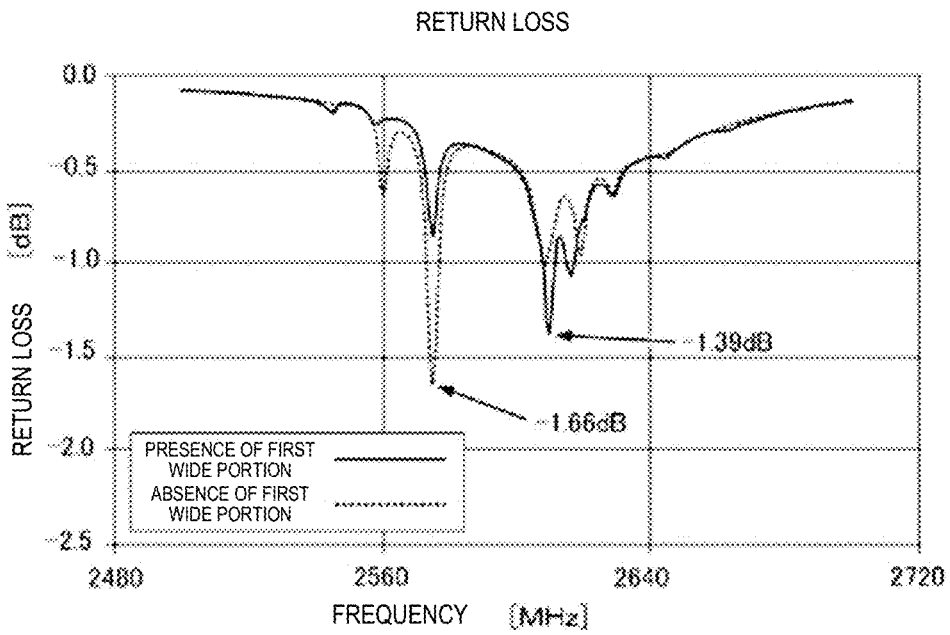
FIGS. 10A and 10B illustrate relationships between the return loss and the size of a wide portion of each floating electrode of the acoustic wave device according to the first preferred embodiment of the present invention.
Figure 10B:
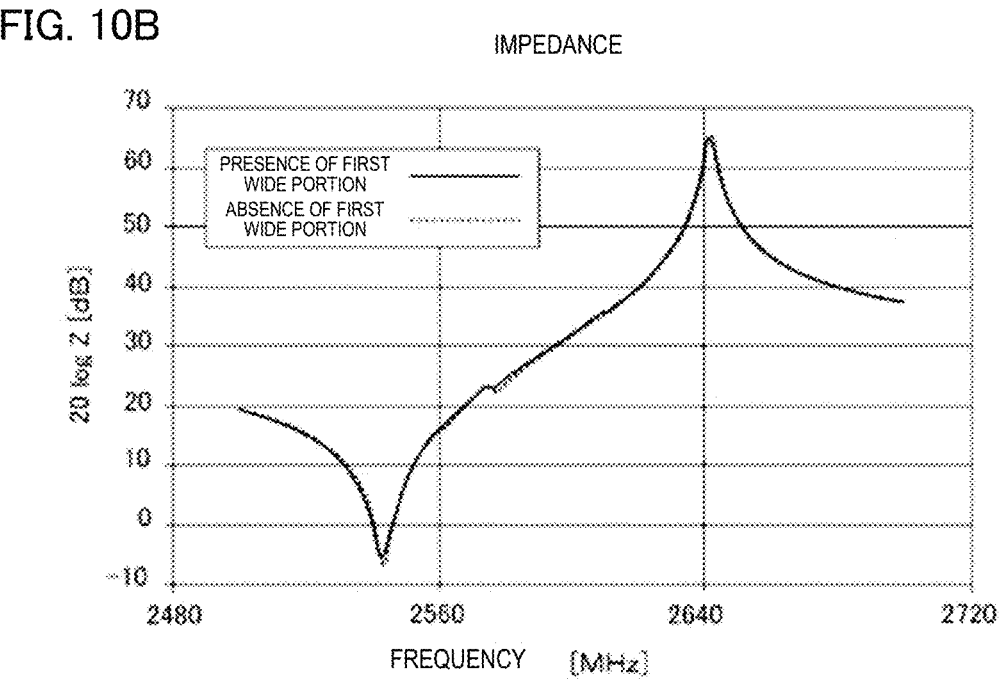

FIGS. 10A and 10B illustrate the result of evaluation of the return loss characteristics and the impedance characteristics depending on the presence or absence of the first wide portions 36 of the floating electrodes of the acoustic wave device 1 in a simulation. The value of the return loss illustrated in FIG. 10A is the value (worst value) of the worst return loss.

In FIGS. 10A and 10B, a solid line represents the return loss in the case where the floating electrodes 101 include the first wide portions 36, and a dashed line represents the return loss in the case where the floating electrodes 101 do not include the first wide portions 36. As clear from FIG. 10A, it can be understood that the worst value of the return loss is about −1.66 dB in the case where the floating electrodes 101 do not include the first wide portions 36 whereas the worst value is about −1.39 dB and is improved in the case where the floating electrodes 101 include the first wide portions 36. It can be understood from FIG. 10B that in the case where the floating electrodes include the first wide portions 36, the impedance characteristics are good. Accordingly, it can be understood that the first wide portions 36 that are included in the floating electrodes 101 enable the ripple in the transverse mode to be effectively reduced. The size $\gamma$ of each first wide portion 36 of the floating electrodes 101 described herein in the direction (the y-direction) in which the electrode fingers extend is about $0.5\lambda$.

Figure 11:
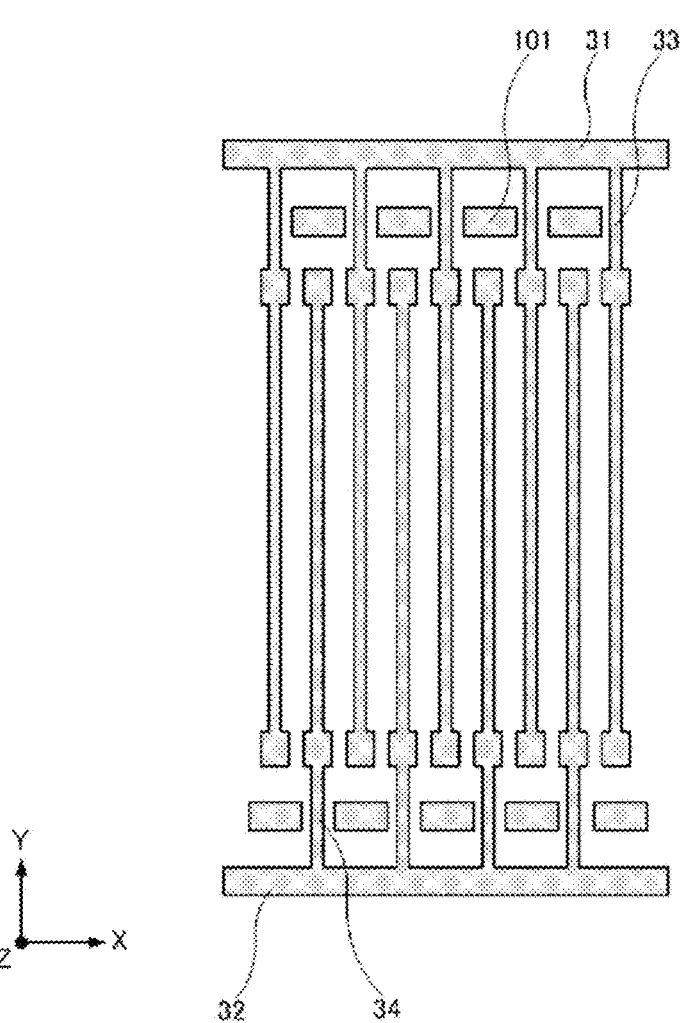
FIG. 11 is a partially cut plan view of an electrode structure according to a second modification to the acoustic wave device according to the first preferred embodiment of the present invention.

Second Modification to Acoustic Wave Device According to First Preferred Embodiment FIG. 11 is a partially cut plan view of an electrode structure according to a second modification to the acoustic wave device 1 according to the first preferred embodiment of the present invention. In the electrode structure according to the second modification, the floating electrodes 101 that have long sides extending in the direction in which the acoustic wave propagates and that are rectangular are formed in the first region D and the second region E.

Also, with this structure, the acoustic velocity in portions of the second region E and the first region D is lower than the acoustic velocity in the busbar regions F. More specifically, the acoustic velocity in regions in which the floating electrodes 101 are provided in the first region D and the second region E is lower than the acoustic velocity in the busbar regions F. Accordingly, the ripple in the transverse mode can be reduced as in the first preferred embodiment.

SECOND PREFERRED EMBODIMENT

Figure 12:
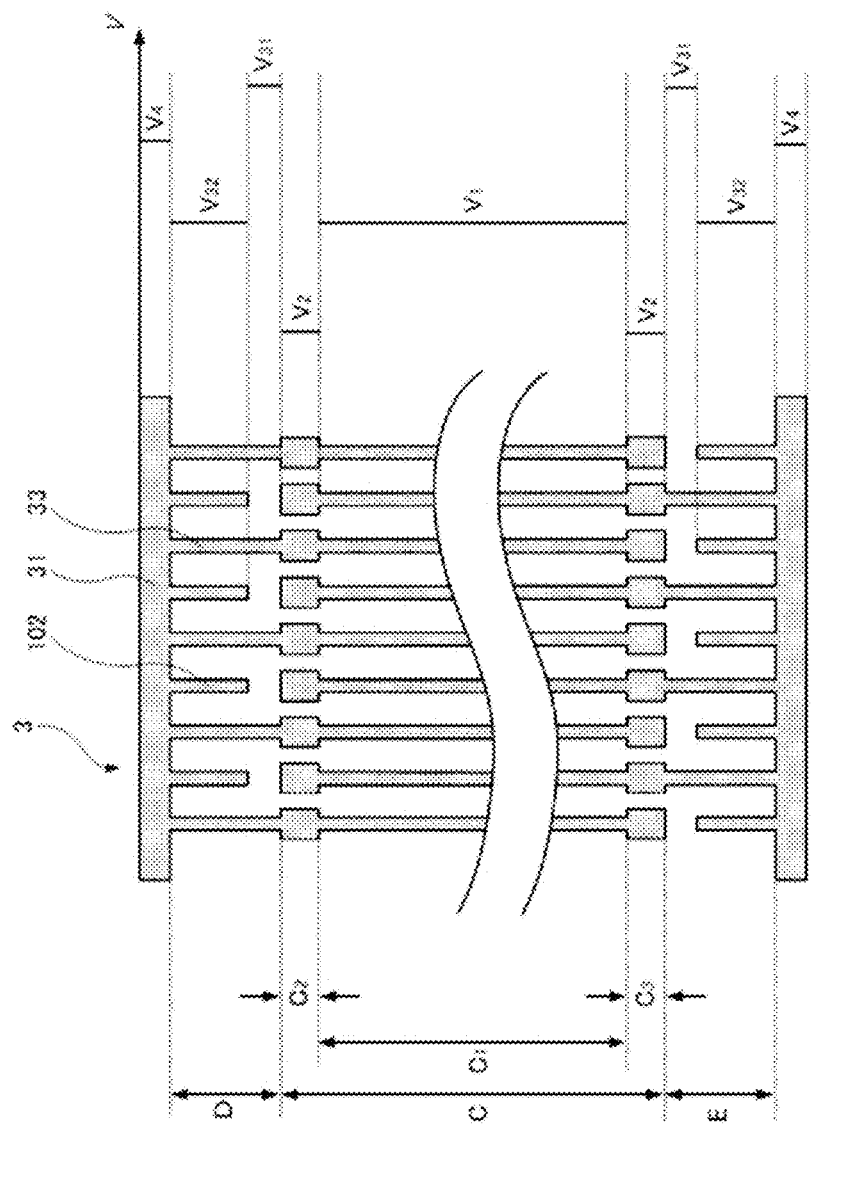
FIG. 12 is a partially cut plan view of an electrode structure and the acoustic velocity in regions of an acoustic wave device according to a second preferred embodiment of the present invention.

FIG. 12 is a partially cut plan view of an electrode structure and the acoustic velocity in regions of an acoustic wave device 3 according to a second preferred embodiment of the present invention. The acoustic wave device 3 according to the second preferred embodiment preferably has the same structure as the acoustic wave device 1 according to the first preferred embodiment except for the electrode structure in the first region D and the second region E and the acoustic velocity in the first region D and the second region E that does not satisfy the relationship in acoustic velocity illustrated in FIGS. 3A and 3B.

The interdigital transducer electrode 11 of the acoustic wave device 3 according to the second preferred embodiment preferably includes members that extend in the direction (the y-direction) in which the electrode fingers extend in the first region D and the second region E, here, dummy electrode fingers 102. The dummy electrode fingers 102 are arranged in the direction (the x-direction) in which the acoustic wave propagates. The tip ends of the dummy electrode fingers 102 face the electrode finger wide portions 38 near the tip ends of the electrode fingers. The base ends of the dummy electrode fingers 102 are connected to the first busbar 31 or the second busbar 32.

The relationship in acoustic velocity in the regions of the acoustic wave device 3 according to the second preferred embodiment is illustrated in FIG. 12.

The acoustic velocity in the central region C1 is V1. The acoustic velocity in the first edge region C2 and the second edge region C3 is V2. The acoustic velocity in the busbar regions F is V4. The acoustic velocity in the first region D and the second region E between the first edge region C2 and the busbar regions F and between the second edge region C3 and the busbar regions F has different values. The acoustic velocity in regions between the first edge region C2 and the tip ends of the dummy electrode fingers 102 is V31. The acoustic velocity in the regions of the dummy electrode fingers 102 is V32. In this case, the acoustic velocities V1, V2, V31, V32, and V4 satisfy a relationship of V31>V4>V1≈V32>V2. In particular, V4>V32 is satisfied, and it can be understood from this that the acoustic velocity in portions of the second region E and the first region D is lower than the acoustic velocity in the busbar regions F.

The interdigital transducer electrode 11 thus has the relationship in acoustic velocity. Consequently, the acoustic velocity in portions of the second region E and the first region D is lower than the acoustic velocity in the busbar regions, and the acoustic wave device 3 according to the second preferred embodiment can reduce the ripple in the transverse mode as in the first preferred embodiment.

Figure 13A:
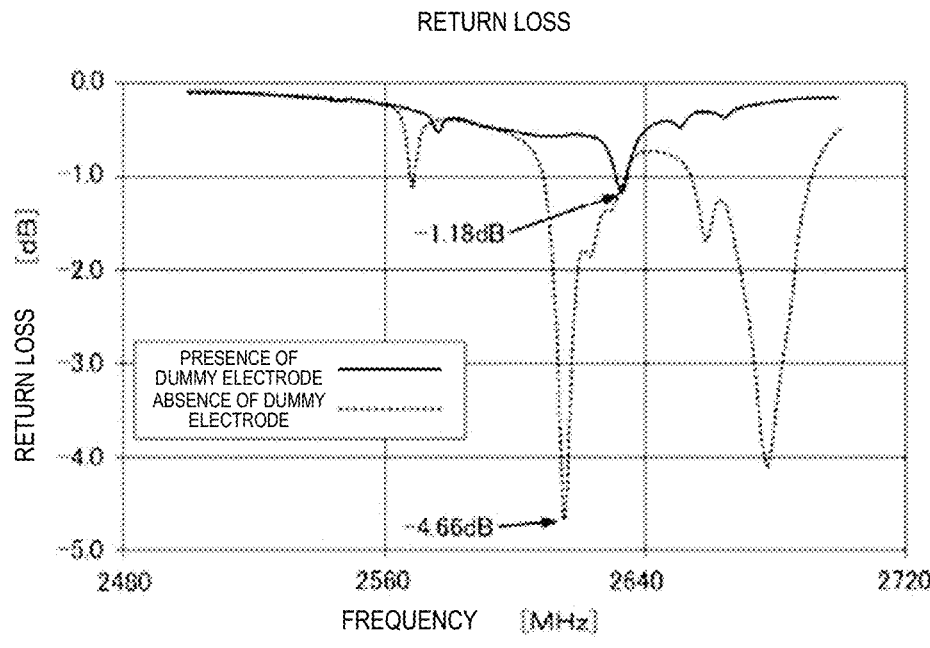
FIGS. 13A and 13B illustrate the return loss characteristics of the acoustic wave device according to the second preferred embodiment of the present invention depending on the presence or absence of dummy electrode fingers.
Figure 13B:
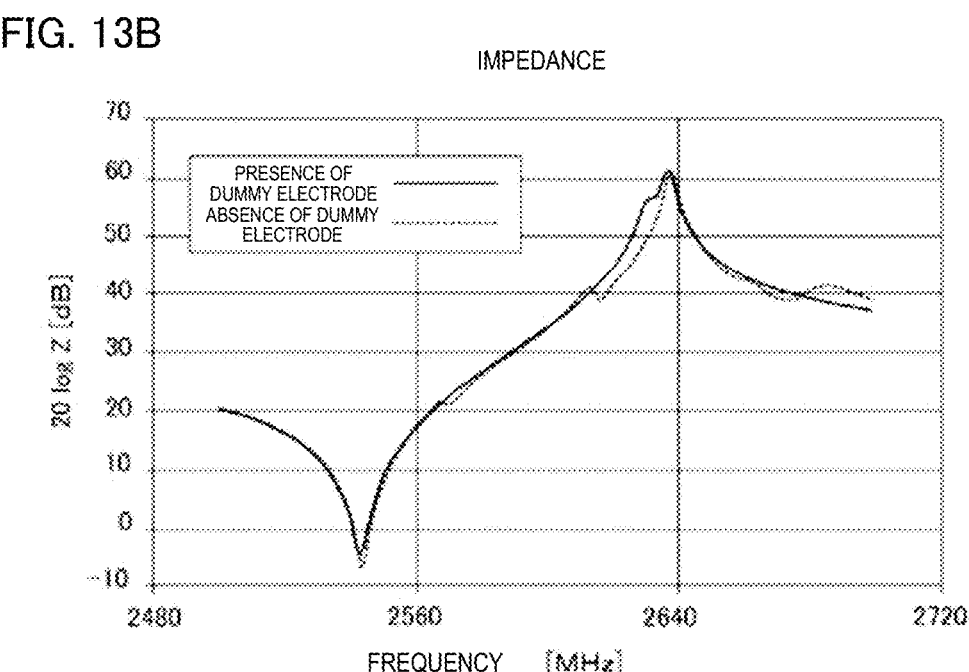

FIGS. 13A and 13B illustrate the return loss characteristics and the impedance characteristics depending on the presence or absence of the dummy electrode fingers 102 in the first region D and the second region E of the acoustic wave device 3. In FIGS. 13A and 13B, a solid line represents the case where the dummy electrodes are placed, and a dashed line represents the case where the dummy electrodes are not provided.

As clear from FIG. 13A, in the case where the dummy electrode fingers 102 are present, the worst value of the return loss is improved from about −4.7 dB to about −1.2 dB unlike the case where the dummy electrode fingers 102 are not present. It can be understood from FIG. 13B that in the case where the dummy electrode fingers 102 are present, the impedance characteristics are good. That is, it can be understood that the dummy electrode fingers 102 enable the ripple in the transverse mode to be effectively reduced. The size of each dummy electrode finger 102 described herein in the direction (the y-direction) in which the electrode fingers extend is about 1λ where λ is the wavelength of the surface acoustic wave.

Figure 14:
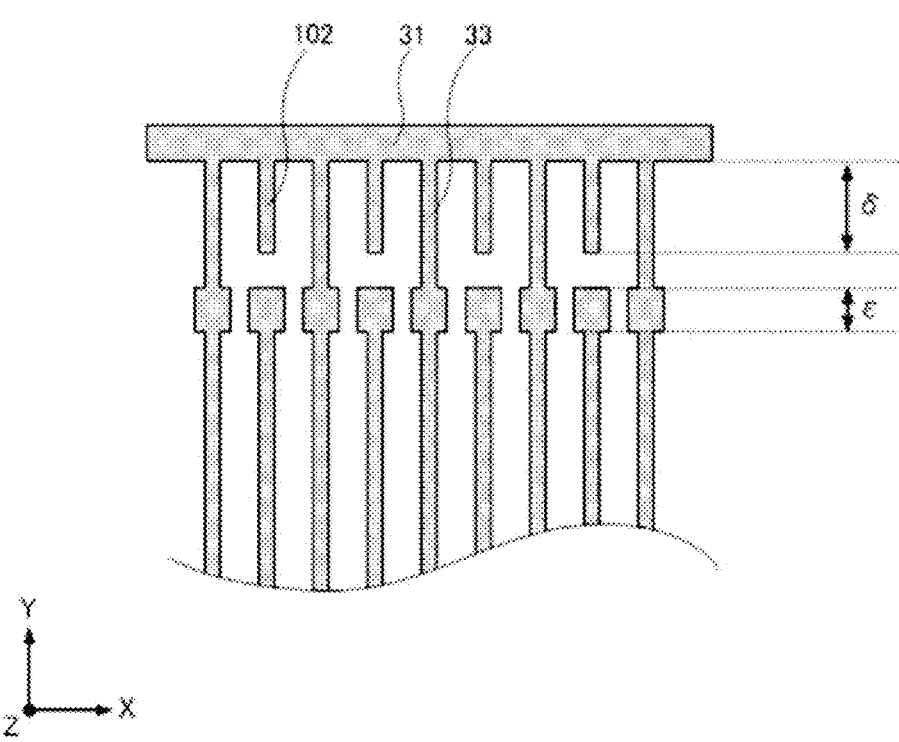
FIG. 14 is a plan view of an enlarged portion in FIG. 11.

Based on the result described above, the size δ of each dummy electrode finger 102 illustrated in FIG. 14 in the direction (the y-direction) in which the electrode fingers extend and the length ε of each electrode finger wide portion 38 of the electrode fingers in the direction in which the electrode fingers extend in the acoustic wave device 2 were changed into various values, and the return loss characteristics and the impedance characteristics were evaluated. The result is illustrated in FIGS. 15A and 15B and FIGS. 16A and 16B.

Figure 15A:
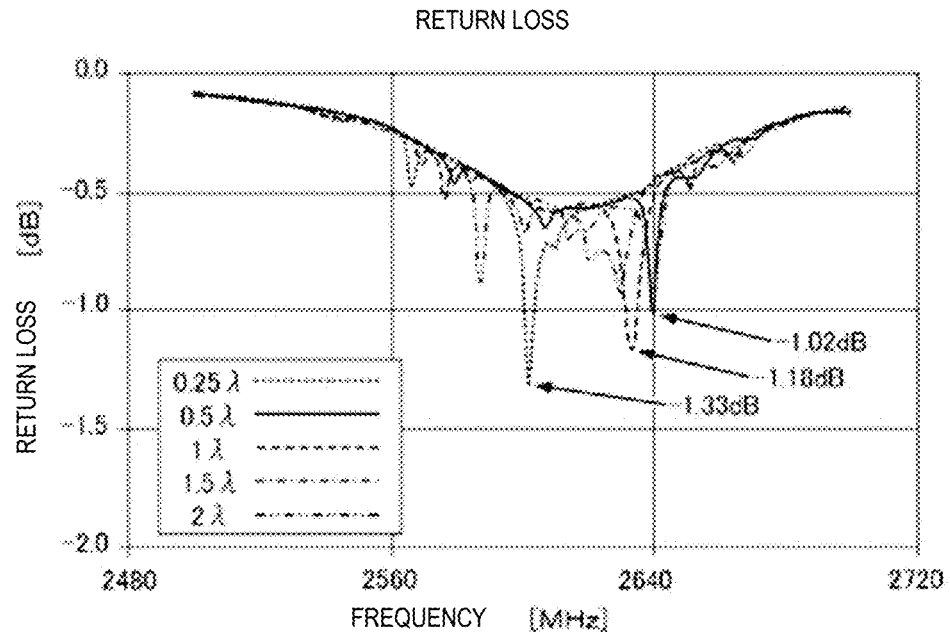
FIGS. 15A and 15B illustrate relationships among the impedance, the return loss, and the size of each dummy electrode finger of the acoustic wave device according to the second preferred embodiment of the present invention.
Figure 15B:
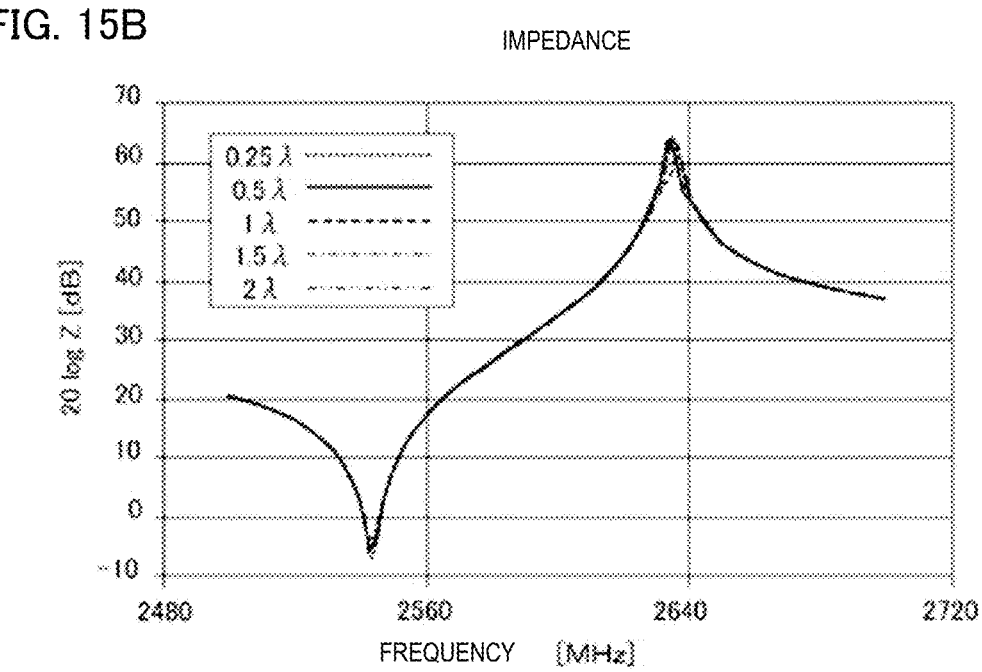

In FIGS. 15A and 15B, as for the size δ of each dummy electrode finger 102 in the direction in which the electrode fingers extend, a fine dashed line represents the case where δ about 0.25λ is satisfied, a solid line represents the case where δ=about 0.5λ is satisfied, a rough dashed line represents the case where δ=about 1λ is satisfied, a one-dot chain line represents the case where δ=about 1.5λ is satisfied, and a two-dot chain line represents the case where δ=about 2λ is satisfied. It can be understood from FIG. 15A that the return loss is about −1.33 dB when the size satisfies δ=about 0.25λ and that the return loss is improved to about −1.0 dB when the size satisfies δ=about 0.5λ, δ=about 1λ, δ=about 1.5λ, and δ=about 2λ. Referring to FIG. 15B, the result is good when the size satisfies δ=about 0.5λ, δ=about 1λ, δ=about 1.5λ, and δ=about 2λ. Accordingly, in the case where the size δ in the direction in which the dummy electrode fingers 102 extend is about 0.5λ or more, the ripple in the transverse mode can be more effectively reduced. The size δ in the direction in which the dummy electrode fingers 102 extend may be about 3λ or less. In this case, the productivity is likely to be improved.

Figure 16A:
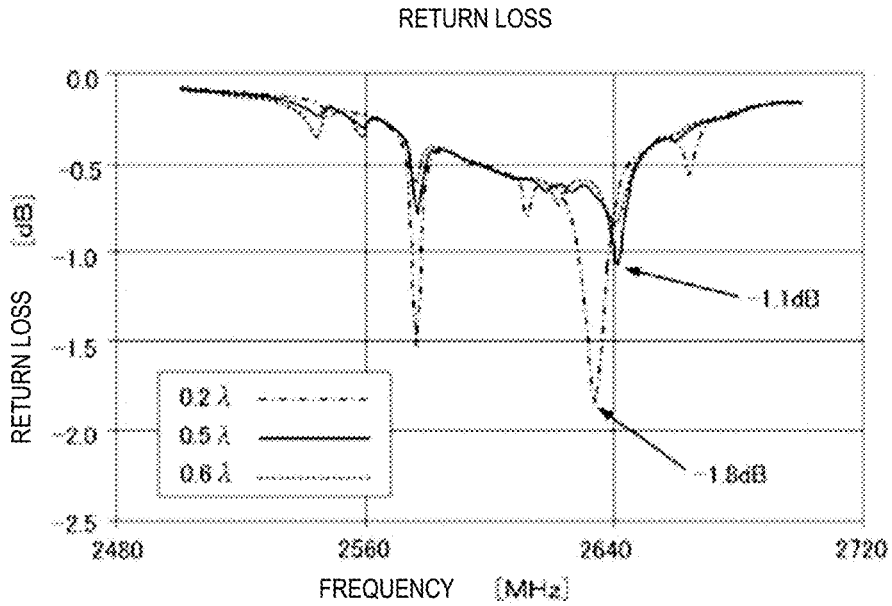
FIGS. 16A and 16B illustrate relationships between the return loss and the size of a wide portion of each of electrode fingers of an interdigital transducer electrode of the acoustic wave device according to the second preferred embodiment of the present invention.
Figure 16B:
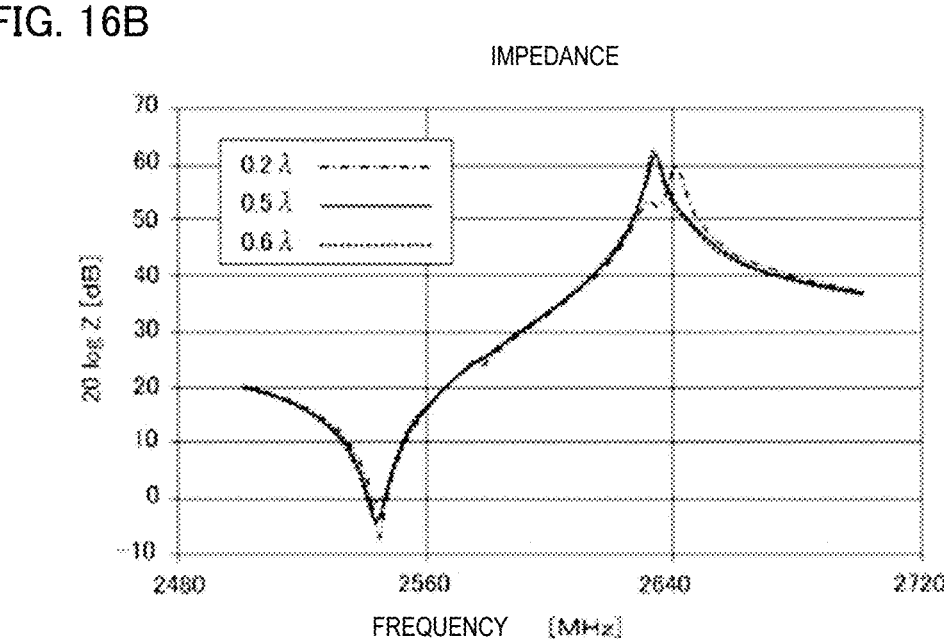

In FIGS. 16A and 16B, a one-dot chain line represents the impedance characteristics and the return loss characteristics in the cases where ε=about 0.2λ is satisfied, a solid line represents the impedance characteristics and the return loss characteristics in the cases where ε=about 0.5λ is satisfied, and a dashed line represents the impedance characteristics and the return loss characteristics in the cases where ε=about 0.6λ is satisfied. As clear from FIG. 16A, it can be understood that in the cases of ε=about 0.5λ and ε=about 0.6λ, the worst value of the return loss is explicitly decreased unlike the case where the size ε of each electrode finger wide portion 38 of the electrode fingers is about 0.2λ. Referring to FIG. 16B, as for the impedance characteristics, the ripple particularly at about 2640 Hz is good in the cases of ε=about 0.5λ and ε=about 0.6λ. Accordingly, in the case where the size ε of each electrode finger wide portion 38 of the electrode fingers is about 0.5λ or more, the ripple in the transverse mode can be further reduced. The length ε of each electrode finger wide portion 38 of the electrode fingers in the direction in which the electrode fingers extend may be about 2λ or less. In this case, the productivity is likely to be improved.

Modification to Second Preferred Embodiment

Figures 17A, 17B:
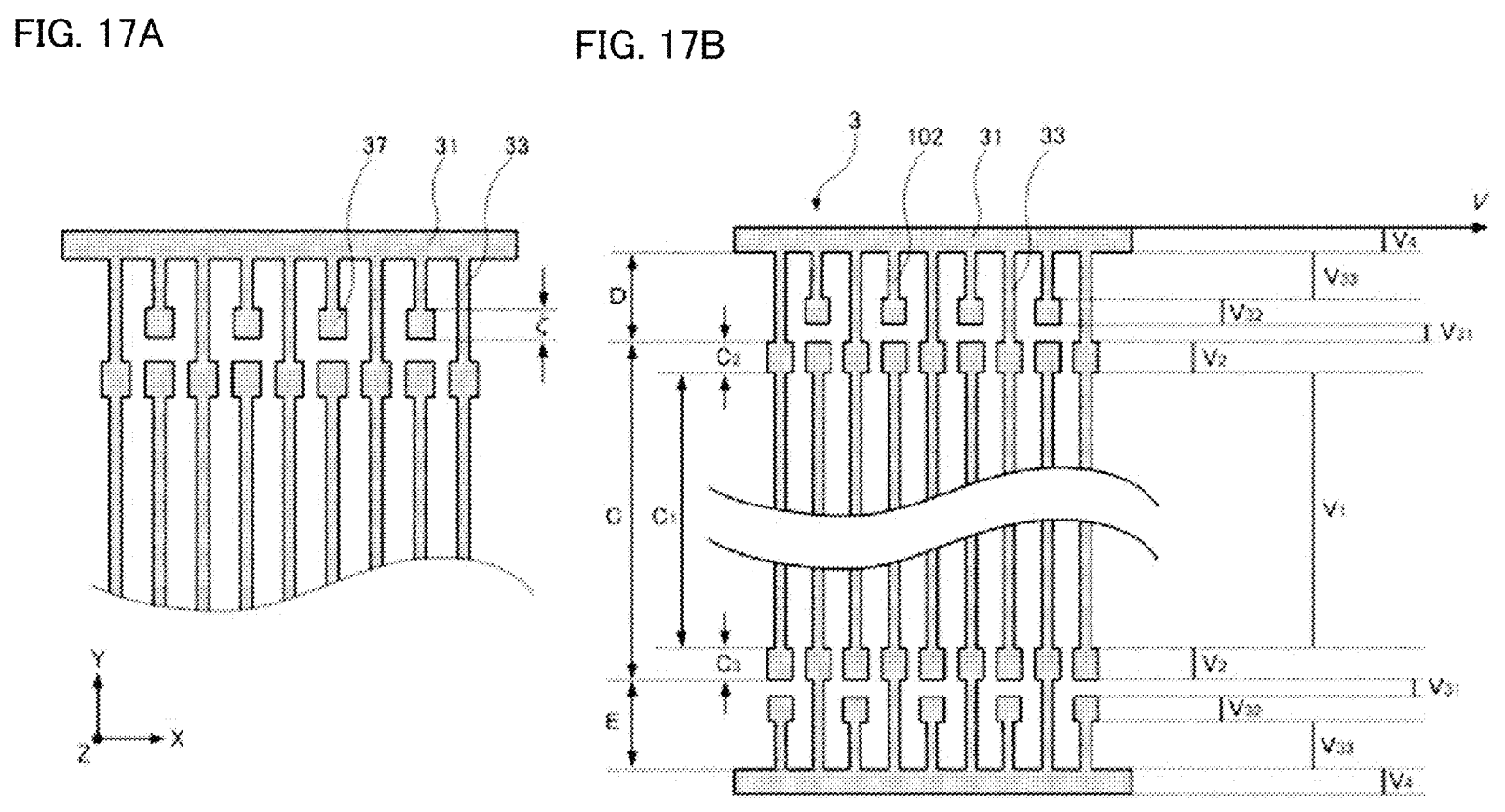

FIGS. 17A and 17B are partially cut plan views of an electrode structure and the acoustic velocity in regions according to a first modification to the acoustic wave device 3 according to the second preferred embodiment. The acoustic wave device 3 according to the first modification preferably has the same structure as the acoustic wave device 3 according to the second preferred embodiment except for the dummy electrode fingers 102 that have wide portions and the relationship in acoustic velocity between the dummy electrode fingers 102 and the central region C1.

The dummy electrode fingers 102 of the acoustic wave device 3 according to the first modification include at least two different dimensions in the width direction that is perpendicular to the direction in which the electrode fingers extend. Specifically, the dimension of the tip end of each dummy electrode finger 102 in the width direction is larger than the dimension of the base end in the width direction. The wide portions of the dummy electrode fingers 102 that have the largest dimension in the width direction are referred to as second wide portions 37.

The acoustic velocity in the regions of the acoustic wave device 3 according to the first modification is illustrated in FIG. 17B.

The acoustic velocity in the central region C1 is V1. The acoustic velocity in the first edge region C2 and the second edge region C3 is V2. The acoustic velocity in the busbar regions F is V4. The acoustic velocity in the first region D and the second region E between the first edge region C2 and the busbar regions F and between the second edge region C3 and the busbar regions F has multiple different values. The acoustic velocity in regions between the first edge region C2 and the second wide portions 37 of the dummy electrode fingers is V31. The acoustic velocity in regions of the second wide portions 37 of the dummy electrode fingers is V32. The acoustic velocity in regions of the dummy electrode fingers outside the second wide portions 37 is V33. In this case, the acoustic velocities V1, V2, V31 to V33, and V4 satisfy V31>V4>V1≈V33>V32>V2.

In this case, the acoustic velocity V32 in the second wide portions 37 of the dummy electrode fingers is lower than the acoustic velocity V4 in the busbar regions F and the acoustic velocity V1 in the central region C1. Accordingly, the acoustic velocity in the second wide portions 37 of the dummy electrode fingers corresponds to that in the low acoustic velocity regions. Accordingly, the high acoustic velocity regions decrease, and the ripple in the transverse mode can consequently be further reduced.

Figure 18A:
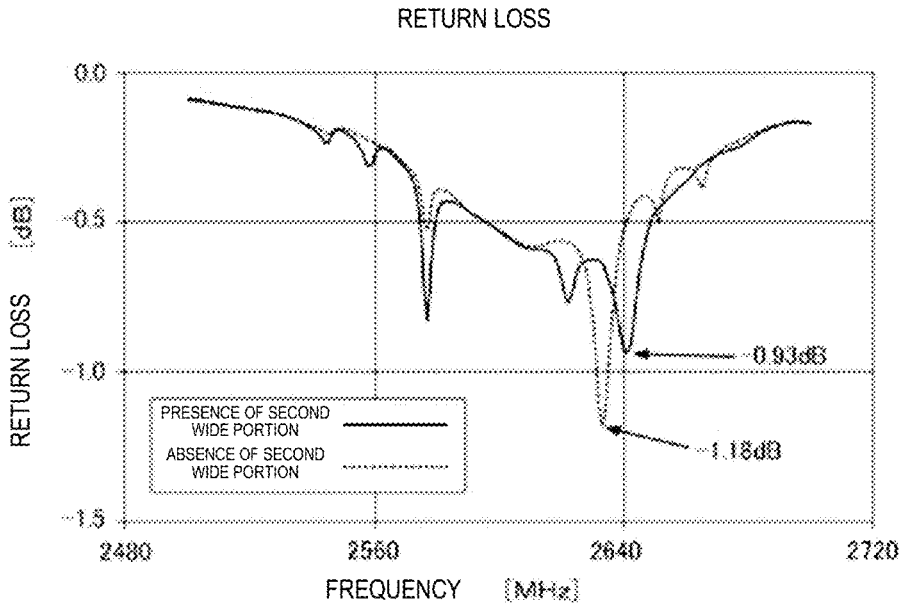
FIGS. 18A and 18B illustrate relationships between the return loss and the size of a wide portion of each dummy electrode finger of the acoustic wave device according to the second preferred embodiment of the present invention.
Figure 18B:
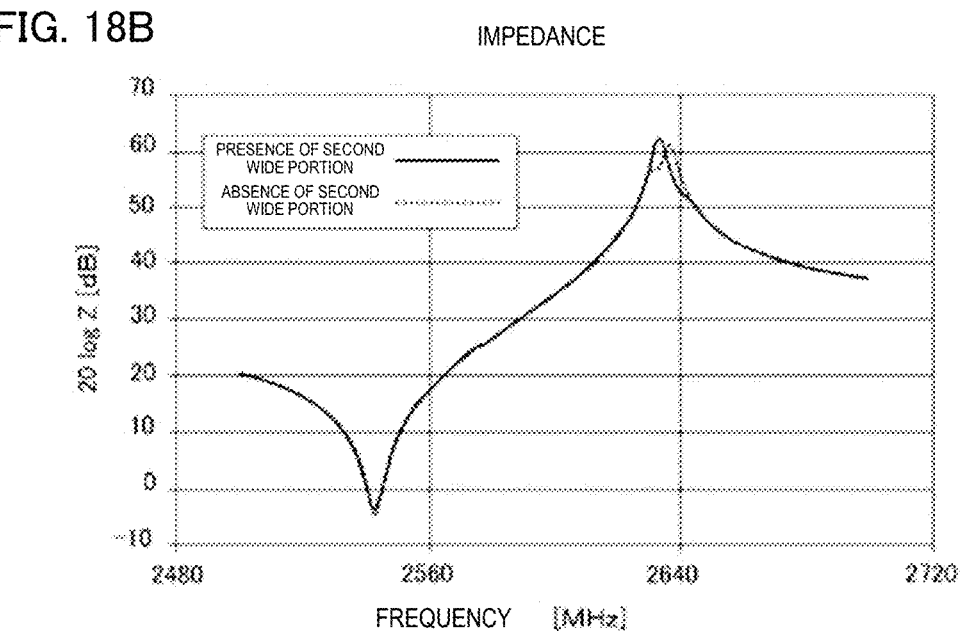

FIGS. 18A and 18B illustrate the result of evaluation of the return loss characteristics and the impedance characteristics depending on the presence or absence of the second wide portions 37 of the dummy electrode fingers of the acoustic wave device 3 in a simulation. The value of the return loss illustrated in FIG. 18A is the value (worst value) of the worst return loss.

In FIGS. 18A and 18B, a solid line represents the return loss in the case where the dummy electrode fingers 102 include the second wide portions 37, and a dashed line represents the return loss in the case where the dummy electrode fingers 102 do not include the second wide portions 37. As clear from FIG. 18A, it can be understood that the worst value of the return loss is about −1.18 dB in the case where the dummy electrode fingers do not include the second wide portions 37 whereas the worst value is about −0.93 dB and is improved in the case where the dummy electrode fingers include the second wide portions 37.

As clear from FIG. 18B, it can be understood that in the case where the dummy electrode fingers 102 include the second wide portions 37, the impedance characteristics are good particularly at about 2600 MHz unlike the case where the second wide portions are not present and that the ripple in the transverse mode can consequently be effectively reduced.

As for the acoustic wave device 3 in which the high acoustic velocity material layer, the low acoustic velocity material layer 14, and the piezoelectric film 10 are stacked, the dummy electrode fingers 102 enable the high acoustic velocity regions to decrease and enable the ripple in the transverse mode to be reduced as described above. The size and the presence or absence of the dummy electrode fingers 102 and the second wide portions 37 of the dummy electrode fingers are set, and the ripple in the transverse mode can consequently be further reduced.

Second to Fourth Modifications to Acoustic Wave Device According to Second Preferred Embodiment FIGS. 19A to 19C are partially cut plan views of electrode structures according to second to fourth modifications to the acoustic wave device 3 according to the second preferred embodiment of the present invention.

FIG. 19A is the partially cut plan view of the electrode structure according to the second modification to the acoustic wave device 3 according to the second preferred embodiment of the present invention. Members that extend in the direction in which the electrode fingers extend, here, the dummy electrode fingers 102 are formed only in the first region D.

FIG. 19B is the partially cut plan view of the electrode structure according to the third modification to the acoustic wave device 3 according to the second preferred embodiment of the present invention. The dummy electrode fingers 102 are not consecutively provided but are intermittently located in the direction in which the acoustic wave propagates in the first region D and the second region E. More specifically, it is not necessary for the dummy electrode fingers 102 to be provided over all the regions between the electrode fingers and the busbars facing the electrode fingers in the first region D and the second region E, but the dummy electrode fingers 102 are provided in portions thereof.

FIG. 19C is the partially cut plan view of the electrode structure according to the fourth modification to the acoustic wave device 3 according to the second preferred embodiment of the present invention. The dummy electrode fingers 102 that have long sides extending in the direction in which the acoustic wave propagates and that are rectangular or substantially rectangular are provided in the first region D and the second region E.

With the structures in FIGS. 19A to 19C described above, the acoustic velocity in portions of the second region E and the first region D is lower than the acoustic velocity in the busbar regions F. Accordingly, the ripple in the transverse mode can be reduced as in the first and second preferred embodiments.

As for the second to fourth modifications illustrated in FIGS. 19A to 19C, the members that are provided in the first region D or the second region E are the dummy electrode fingers 102 that are rectangular. However, these are examples and can be replaced or combined with components, for example, the floating electrodes 101. The shape is not limited to a rectangular shape but may be a square shape, a circular shape, or another shape.

THIRD PREFERRED EMBODIMENT

FIG. 20 is a front view of a section of an acoustic wave device 4 according to a third preferred embodiment. As for the acoustic wave device 4, a high acoustic velocity material layer 13B, the low acoustic velocity material layer 14, and the piezoelectric film 10 made of lithium tantalate are stacked on a support substrate 13A. Since the high acoustic velocity material layer 13B is provided, the support substrate 13A may be made of a material other than a high acoustic velocity material. However, the support substrate 13A may be made of a high acoustic velocity material.

The acoustic wave device 4 according to the present preferred embodiment preferably has the same structure except that the high acoustic velocity material layer that is a high acoustic velocity material film differs from the high acoustic velocity material layer illustrated in FIG. 2. Specifically, the difference is that the high acoustic velocity material layer corresponds to the high acoustic velocity support substrate 13 in FIG. 2 whereas the acoustic wave device 4 includes the support substrate 13A that supports the high acoustic velocity material layer 13B in FIG. 20. Accordingly, a substantially common matter is that the acoustic velocity in portions of the second region E and the first region D is lower than the acoustic velocity in the busbar regions F, and the acoustic wave device 4 according to the third preferred embodiment can consequently reduce the ripple in the transverse mode.

An example of the material of the high acoustic velocity support substrate 13 is silicon. The material of the high acoustic velocity support substrate 13 is not limited to silicon but may be, for example, a piezoelectric material such as sapphire, lithium tantalate, lithium niobate, or crystal, any of various kinds of ceramics such as alumina, magnesia, silicon nitride, aluminum nitride, silicon carbide, zirconia, cordierite, mullite, steatite, or forsterite, a dielectric such as glass, or a semiconductor such as gallium nitride, or a resin substrate, for example, is also acceptable.

In the case where a multilayer substrate that includes the high acoustic velocity material layer, the low acoustic velocity material layer 14, and the piezoelectric film 10 as illustrated in FIG. 2 and FIG. 20 is used, the thickness of the piezoelectric film 10 is preferably about $3.5\lambda$ or less where $\lambda$ is the wavelength of the surface acoustic wave. Japanese Unexamined Patent Application Publication No. 2011-101350 described above discloses that if the film thickness of lithium tantalate is more than about $3.5\lambda$, Q characteristics are degraded. Accordingly, the film thickness of lithium tantalate is preferably, for example, about $3.5\lambda$ or less in order to improve the Q characteristics.

The high acoustic velocity material described above can be, for example, aluminum nitride, aluminum oxide, silicon nitride, or DLC film.

The low acoustic velocity material described above can be an inorganic insulating material such as, for example, silicon oxide or silicon oxynitride or a resin material.

The high acoustic velocity material and the low acoustic velocity material can be a combination of appropriate materials, provided that the relationship in acoustic velocity described above is satisfied.

The support substrate can be made of, for example, a piezoelectric material such as sapphire, lithium tantalate, lithium niobate, or crystal, any of various kinds of ceramics such as alumina, magnesia, silicon nitride, aluminum nitride, silicon carbide, zirconia, cordierite, mullite, steatite, or forsterite, a dielectric such as glass, or a semiconductor such as silicon or gallium nitride and can be a resin substrate.

FOURTH PREFERRED EMBODIMENT

FIGS. 21A and 21B are partially cut plan views of a principal portion of an acoustic wave device 5 according to a fourth preferred embodiment. The acoustic wave device 5 according to the fourth preferred embodiment preferably has the same structure as the acoustic wave device 1 according to the first preferred embodiment except for the presence or absence of the wide portions of the first electrode fingers 33 and the second electrode fingers 34.

The electrode fingers 33, 34 of the acoustic wave device 5 according to the fourth preferred embodiment do not include the electrode finger wide portions 38 unlike the first preferred embodiment as described above. As illustrated in FIG. 21A, however, dielectric films 103 that serve as mass addition films are stacked on portions of the first electrode fingers 33 and the second electrode fingers 34 in the first edge region C2 and the second edge region C3. Consequently, the acoustic velocity in the first edge region C2 and the second edge region C3 is lower than that in the central region C1.

In the first edge region C2 and the second edge region C3, the dielectric films 15 described above may be stacked in the upward direction (surfaces of the electrode fingers opposite surfaces on the piezoelectric film) of the first and second electrode fingers when viewed in the direction in which the acoustic wave propagates or may be stacked in the downward direction (between the electrode fingers and the piezoelectric film). As illustrated in FIG. 21B, the dielectric films 15 may be provided so as to cover the interdigital transducer electrode 11. In this case, the interdigital transducer electrode 11 can be protected, and frequency can be adjusted. That is, the frequency can be adjusted by adjusting the thickness or material of the dielectric films 15.

According to the fourth preferred embodiment described above, the dielectric films 15 are stacked on the portions of the first and second electrode fingers 33 and 34 in the first edge region C2 and the second edge region C3, and consequently, the acoustic velocity in the first edge region C2 and the second edge region C3 is a low acoustic velocity. In addition, the acoustic velocity in portions of the second region E and the first region D is lower than the acoustic velocity in the busbar regions F, and the ripple in the transverse mode can consequently be reduced as in the first preferred embodiment.

Other Modifications

According to the preferred embodiments described above, all of the first electrode fingers 33 and the second electrode fingers 34 include the electrode finger wide portions 38 near the tip ends and the base ends. However, the electrode finger wide portions 38 may be included in the first electrode fingers 33 or the second electrode fingers 34, provided that the acoustic velocity in the first edge region C2 and the second edge region C3 in which the electrode finger wide portions 38 are located is a low acoustic velocity. As for the number of the electrode finger wide portions 38, a single electrode finger may include only a single electrode finger wide portion 38 at the tip end or the base end, and it is not necessary for all of the electrode fingers to include the electrode finger wide portions 38.

Also, as for the first wide portions 36 that are included in the floating electrodes 101, it is not necessary for all of the floating electrodes 101 to include the first wide portions 36. Only some of the floating electrodes may include the first wide portions 36, provided that the acoustic velocity in portions of the second region E and the first region D is lower than the acoustic velocity in the busbar regions F. Similarly, as for the second wide portions 37 that are included in the dummy electrode fingers 102, only some of the dummy electrode fingers 102 may include the second wide portions 37.

According to the first to fourth preferred embodiments, a single-port acoustic wave resonator is described. According to the present invention, however, an acoustic wave device that has another electrode structure such as, for example, an acoustic wave filter may be used provided that the interdigital transducer electrode has the structure described above.

According to the preferred embodiments and the modifications described above, the acoustic wave devices each of which includes a surface acoustic wave device are described. The surface acoustic wave according to the preferred embodiments and the modifications described above includes an acoustic wave that propagates along the surface of the piezoelectric material or an interface between multiple materials and means various kinds of acoustic waves that are produced by using the interdigital transducer electrode. Examples of the surface acoustic wave include a Love wave, a Leaky wave, a Rayleigh wave, a pseudo SAW, and a Lamb wave.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a piezoelectric film;

a high acoustic velocity material layer through which a bulk wave propagates at an acoustic velocity higher than an acoustic velocity at which an acoustic wave propagates through the piezoelectric film;

a low acoustic velocity material layer through which a bulk wave propagates at an acoustic velocity lower than an acoustic velocity at which a bulk wave propagates through the piezoelectric film; and an interdigital transducer electrode provided on the piezoelectric film; wherein the low acoustic velocity material layer and the piezoelectric film are stacked in this order on the high acoustic velocity material layer;

the interdigital transducer electrode includes a first busbar and a second busbar that oppose each other, multiple first electrode fingers each of which includes a base end that is connected to the first busbar and a tip end that extends toward the second busbar, and multiple second electrode fingers each of which includes a base end that is connected to the second busbar and a tip end that extends toward the first busbar;

the multiple first electrode fingers and the multiple second electrode fingers overlap in an overlapping region in a direction in which the acoustic wave propagates, and the overlapping region includes a central region, a first edge region that is located between the central region and the first busbar, and a second edge region that is located between the central region and the second busbar;

an acoustic velocity in the first edge region and an acoustic velocity in the second edge region are lower than an acoustic velocity in the central region;

the first busbar and the second busbar are provided in a busbar region, and an acoustic velocity in the busbar region is higher than the acoustic velocity in the central region; and a first region is between the first edge region and the first busbar, a second region is between the second edge region and the second busbar, and an acoustic velocity in a portion of the second region and the first region is lower than the acoustic velocity in the busbar region.

2. The acoustic wave device according to claim 1, wherein a width direction is perpendicular or substantially perpendicular to a direction in which the multiple first electrode fingers and the multiple second electrode fingers extend, and at least one of the multiple first electrode fingers or the multiple second electrode fingers-includes an electrode finger wide portion that is located at least in the first or second edge region and that has a dimension in the width direction larger than that at a center of the at least one of the multiple first electrode fingers or the multiple second electrode fingers in the direction in which the multiple first electrode fingers and the multiple second electrode fingers extend.

3. The acoustic wave device according to claim 1, wherein a member is placed at least in the first region or the second region.

4. The acoustic wave device according to claim 3, wherein the member extends in a direction in which the multiple first electrode fingers and the multiple second electrode fingers extend.

5. The acoustic wave device according to claim 3, wherein the member is a floating electrode that is not connected to either of the first busbar and the second busbar.

6. The acoustic wave device according to claim 5, wherein the floating electrode has a size of about $0.75\lambda$ or more in a direction in which the multiple first electrode fingers and the multiple second electrode fingers extend, where $\lambda$ is a wavelength of the acoustic wave device.

7. The acoustic wave device according to claim 6, wherein the wavelength of the acoustic wave device corresponds to a repetition period of the multiple first electrode fingers or the multiple second electrode fingers.

8. The acoustic wave device according to claim 2, wherein the electrode finger wide portions in the multiple first electrode fingers and in the multiple second electrode fingers have a size of no less than about $0.4\lambda$ and no more than about $0.6\lambda$ in a direction in which the multiple first and second electrode fingers extend, where $\lambda$ is a wavelength of the acoustic wave device.

9. The acoustic wave device according to claim 8, wherein the wavelength of the acoustic wave device corresponds to a repetition period of the multiple first electrode fingers or the multiple second electrode fingers.

10. The acoustic wave device according to claim 5, wherein a width direction is perpendicular to a direction in which the multiple first electrode fingers and the multiple second electrode fingers extend, and the floating electrode includes a first wide portion that has a relatively increased dimension in the width direction.

11. The acoustic wave device according to claim 3, wherein the member is a dummy electrode finger a base end of which is connected to the first busbar or the second busbar.

12. The acoustic wave device according to claim 11, wherein the dummy electrode finger has a size of about $0.5\lambda$ or more in a direction in which the multiple first electrode fingers and the multiple second electrode fingers extend, where A is a wavelength of the acoustic wave device.

13. The acoustic wave device according to claim 2, wherein the electrode finger wide portions in the multiple first electrode fingers and in the multiple second electrode fingers have a size of about $0.5\lambda$ or more in a direction in which the multiple first and second electrode fingers extend, where $\lambda$ is a wavelength of the acoustic wave device.

14. The acoustic wave device according to claim 11, wherein a width direction is perpendicular or substantially perpendicular to a direction in which the multiple first electrode fingers and the multiple second electrode fingers extend, and the dummy electrode finger includes a second wide portion that has a dimension in the width direction larger than that of the base end that is connected to the first busbar or the second busbar.

15. The acoustic wave device according to claim 1, wherein the high acoustic velocity material layer is a high acoustic velocity support substrate.

16. The acoustic wave device according to claim 1, further comprising a support substrate that supports the high acoustic velocity material layer.

17. The acoustic wave device according to claim 1, wherein a mass addition film is provided on the multiple first electrode fingers and the multiple second electrode fingers at least in the first edge region or the second edge region.

18. The acoustic wave device according to claim 1, wherein in the first region or the second region, members that extend in a direction in which the multiple first electrode fingers and the multiple second electrode fingers extend are located on extension lines along which the tip ends of the multiple second electrode fingers and the multiple first electrode fingers extend toward the first busbar or the second busbar.

19. An acoustic wave device comprising:

a support substrate;

a piezoelectric film made of lithium tantalate or lithium niobate;

a high acoustic velocity material layer made of at least one material selected from a group including aluminum nitride, aluminum oxide, silicon nitride, and DLC film;

a low acoustic velocity material layer made of silicon oxide; and an interdigital transducer electrode that is provided on the piezoelectric film; wherein the high acoustic velocity material layer, the low acoustic velocity material layer, and the piezoelectric film are stacked in this order on the support substrate;

the interdigital transducer electrode includes a first busbar and a second busbar that oppose each other, multiple first electrode fingers each of which includes a base end that is connected to the first busbar and a tip end that extends toward the second busbar, and multiple second electrode fingers each of which includes a base end that is connected to the second busbar and a tip end that extends toward the first busbar;

the multiple first electrode fingers and the multiple second electrode fingers overlap in an overlapping region in a direction in which an acoustic wave propagates, and the overlapping region includes a central region, a first edge region that is located between the central region and the first busbar, and a second edge region that is located between the central region and the second busbar;

an acoustic velocity in the first edge region and an acoustic velocity in the second edge region are lower than an acoustic velocity in the central region;

the first busbar and the second busbar are provided in a busbar region, and an acoustic velocity in the busbar region is higher than the acoustic velocity in the central region; and a first region is between the first edge region and the first busbar, a second region is between the second edge region and the second busbar, and an acoustic velocity in a portion of the second region and the first region is lower than the acoustic velocity in the busbar region.

20. An acoustic wave device comprising:

a piezoelectric film made of lithium tantalate or lithium niobate;

a high acoustic velocity support substrate made of at least one material selected from a group including sapphire, crystal, silicon carbide, and silicon;

a low acoustic velocity material layer made of silicon oxide; and an interdigital transducer electrode that is provided on the piezoelectric film; wherein the low acoustic velocity material layer and the piezoelectric film are stacked in this order on the high acoustic velocity support substrate;

the interdigital transducer electrode includes a first busbar and a second busbar that oppose each other, multiple first electrode fingers each of which includes a base end that is connected to the first busbar and a tip end that extends toward the second busbar, and multiple second electrode fingers each of which includes a base end that is connected to the second busbar and a tip end that extends toward the first busbar;

the multiple first electrode fingers and the multiple second electrode fingers overlap in an overlapping region in a direction in which an acoustic wave propagates, and the overlapping region includes a central region, a first edge region that is located between the central region and the first busbar, and a second edge region that is located between the central region and the second busbar;

an acoustic velocity in the first and second edge regions is lower than an acoustic velocity in the central region;

an acoustic velocity in a busbar region in which the first busbar and the second busbar are provided is higher than the acoustic velocity in the central region; and a first region is between the first edge region and the first busbar, a second region is between the second edge region and the second busbar, and an acoustic velocity in a portion of the second region and the first region is lower than the acoustic velocity in the busbar region.

* * * * *